(12) United States Patent
Oohashi et al.

(10) Patent No.: US 7,255,610 B2
(45) Date of Patent: Aug. 14, 2007

(54) MOLDED PART AND ELECTRONIC DEVICE USING THE SAME

(75) Inventors: Katsuhide Oohashi, Mito (JP); Shigeo Amagi, Tokai-mura (JP); Osamu Miyo, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 69 days.

(21) Appl. No.: 11/320,782

(22) Filed: Dec. 30, 2005

(65) Prior Publication Data

US 2006/0186522 A1    Aug. 24, 2006

(30) Foreign Application Priority Data

Feb. 21, 2005    (JP) .............................. 2005-043326

(51) Int. Cl.
*H01R 13/405* (2006.01)
(52) U.S. Cl. .................................. 439/736; 264/272.17
(58) Field of Classification Search ................ 439/736; 29/883; 264/272.11, 272.15, 272.17, 271.1; 262/272.14
See application file for complete search history.

(56) References Cited

U.S. PATENT DOCUMENTS

| 5,779,963 | A | 7/1998 | Chappaz et al. | |
|---|---|---|---|---|
| 6,152,761 | A * | 11/2000 | Wellinsky et al. | 439/456 |
| 6,187,242 | B1 * | 2/2001 | Onoda | 264/255 |
| 6,780,067 | B1 | 8/2004 | Kono et al. | |

FOREIGN PATENT DOCUMENTS

| EP | 0 361 194 A2 | 4/1990 |
|---|---|---|
| GB | 2 1 12 316 A | 7/1983 |
| JP | 09-107059 | 4/1997 |
| JP | 09-300401 | 11/1997 |
| JP | 2000-183468 | 6/2000 |
| WO | WO 2005/042165 A1 | 5/2005 |
| WO | WO 2005/091441 A1 | 9/2005 |

OTHER PUBLICATIONS

European Search Report dated May 26, 2006 (Eight (8) Pages).

* cited by examiner

*Primary Examiner*—Tho D. Ta
(74) *Attorney, Agent, or Firm*—Crowell & Moring LLP

(57) ABSTRACT

An integrally multiple-molded part for electronic devices is provided capable of absorbing and relieving the internal stresses of a multiple-molded part, preventing the occurrence of clearances between the bonding side face of each electrical connection terminal and a resin, obtaining stable frictional force at the contact region between the bonding surface of the electrical connection terminal and an aluminum wire, obtaining the energy required for bonding, and achieving high bondability. The surface of the molded electrical connection terminal section formed as a primary-molded article becomes exposed after secondary molding, and a stress-absorbing structure is formed in the primary molding resin section of the primary-molded article that serves as a transmission path for stresses associated with the resin shrinkage occurring when the secondary molding resin is cured.

20 Claims, 15 Drawing Sheets

A-A

A-A

A-A

A-A

A-A

MEASURED RESIN SURFACE STRAIN DATA
OF PRIMARY MOLDING (X-DIRECTION)

'A-'A

B-B

C-C

C-C

C-C

C-C

MEASURED RESIN SURFACE STRAIN DATA
OF PRIMARY MOLDING (X-DIRECTION)

D-D

E-E

G-G

MOLDED PART AND ELECTRONIC DEVICE USING THE SAME

BACKGROUND OF THE INVENTION

The present invention relates to molded parts for electronic devices, each obtained by inserting an insert article into a metallic mold and resin-molding the circumference of the insert article. More specifically, the invention relates to an integrally multiple-molded part for electronic devices, obtained by integrally insert-molding a plurality of electrical connection terminals a plurality of times. The invention is also directed to an electronic device that includes a circuit board with an electronic component mounted inside the integrally multiple-molded part for electronic devices.

The increase in electronic control of devices in recent years has brought about the proliferation of the molded parts each obtained by insert-molding from resin a plurality of terminals for electrical connection to outside. In these molded parts, from the viewpoints of productivity and reliability, wire bonding is most commonly used to bond the electrical connection terminals and a circuit board or the like having an electronic component mounted in the molded part.

The electrical connection terminals connected by wire bonding to the circuit board (or the like) having an electronic component mounted in such a molded part are resin-molded for mounting in a fixed condition inside the molded part itself.

When the electrical connection terminals are fixed, however, each of these terminals must be fixed to a desired position without deforming under a resin-filling pressure. Also, for the electrical connection terminals formed by insert-molding, from the viewpoints of their ease of handling and of their productivity, a multiple-molding method is most commonly used to obtain a molded part of the desired final shape or function. In this multiple-molding method, in order to link the plurality of electrical connection terminals, these terminals are first formed by primary molding from resin beforehand and then fixed using the primary molding resin. Next, these plural electrical connection terminals that have been fixed using the primary molding resin are further insert-molded as an insert, and integrated with secondary molding resin.

During the insertion of primary molding resin into the part to be formed by multiple molding, when the metallic mold is filled with fused resin, the fused resin shrinks in a solidification process and the primary molding resin undergoes a stress. The action of this stress causes the deforming stress that acts as bending force upon the product obtained by primary molding. The molding resin in contact in a clearance-free state with a bonding side face is pulled away therefrom by the deforming stress. Consequently, clearances occur and the so-called "rattling" results.

Aluminum wire bonding to the electrical connection terminals mentioned above is accomplished by overlapping an aluminum wire on the electrical connection terminals, then applying vibrational energy from the top of the aluminum wire by use of the bonding horn of a bonding machine, and utilizing the frictional force generated on the bonding surface of each electrical connection terminal and on the contact region of the aluminum wire. Accordingly, if the electrical connection terminals have a clearance or backlash during molding, when the aluminum wire is overlapped on the electrical connection terminals and then the bonding machine is operated to assign ultrasonic vibration via the bonding horn, the electrical connection terminals will become tuned to the aluminum wire and absorb the ultrasonic vibration. This may prevent sufficient frictional force from being generated on the bonding surface of each electrical connection terminal and on the contact region of the aluminum wire, with the result that the energy required for bonding may not be obtainable. If these actually happen, the problem will occur in that connection between the electrical connection terminals and the circuit board or the like having an electronic component mounted in the molded part cannot be established by wire bonding.

Related conventional methods for improving the adhesion between the primary molding resin and second-molding resin in a multiple-molded part are already disclosed. These methods, however, have been such that the metallic section molded by primary molding, such as a molded part for bonding, will have an exposed surface after secondary molding. Therefore, the suppression of the occurrence of the shrinkage stress acting between the metallic section and primary molding resin of the primary-molded article during secondary molding has been difficult. (See Japanese Patent Laid-open Nos. 2000-183468 and 9-300401).

For example, according to Japanese Patent Laid-open No. 2000-183468, during primary molding, the surface to be firmly bonded to the resin section during secondary molding is subjected to fine dimpling to improve adhesion. As described above, however, since the metallic section molded by primary molding, such as a molded part for bonding, will have an exposed surface after secondary molding, it will be difficult to suppress the occurrence of shrinkage stresses during secondary molding.

Also, according to Japanese Patent Laid-open No. 9-300401, a recessed portion and an edge portion are formed in the intermediate position of the linking section for linking the terminals formed as a primary-molded article, the edge portion is fused using the fusion heat of secondary molding resin, and thus the interface to the primary molding resin is removed to improve adhesion. As described above, however, since the metallic section molded by primary molding, such as a molded part for bonding, will have an exposed surface after secondary molding, it will be difficult to suppress the occurrence of a shrinkage stress during secondary molding.

Although this does not relate to a multiple-molded part, another method of preventing the occurrence of clearances between the electrical connection terminals and resin in a molded part for bonding is disclosed in Patent Reference 3, for example. In this method, terminal end portions other than the surface to be bonded have been coated with resin, or each terminal has been provided with bends and embedded in resin, or the reverse side of the section to be bonded has been grooved or dimpled.

According to Japanese Patent Laid-open No. 9-107059, as shown in FIG. 1 thereof, in a molded part that is formed by resin-insert-molding a plurality of terminals for electrical connection to outside, wire bonding is used frequently from the viewpoints of productivity and reliability to bond electrical connection terminals 2 and a circuit board (or the like) having an electronic component 92 mounted in the molded part. In this molded part for bonding, in order to prevent the occurrence of clearances between the electrical connection terminals 2 and resin in the part 1 formed by primary molding, terminal end portions other than the surface to be bonded are coated with resin, or each electrical connection terminal is provided with bends 2g, 2h and embedded in resin, or the reverse side of the terminal 2 is provided with a groove 2b or protrusions 2c, 2d.

Yet another conventional method of preventing the electrical connection terminals of such a bonding-use molded part from resonating with ultrasonic vibration has been executed by applying an adhesive such as an epoxy material to terminal end portions other than the surface to be bonded. That is to say, the applied epoxy resin is hardened for bonding, and movements of the electrical connection terminals are suppressed by utilizing the rigidity of the epoxy resin hardened integrally with the electrical connection terminals.

The increases in the compactness and multifunctionality of connection terminals in recent years, however, have made it necessary to arrange a greater number of connection terminals, and this tendency, in turn, is reducing the terminals in width and in arrangement pitch. Accordingly, the technique described in Patent Reference 3 is coming to pose at least two problems. One is that a sufficient bonding space cannot be obtained at the terminal end portions to be resin-coated or at the terminal end portions to be provided with bends. The other is that since the grooved or dimpled reverse side of the section to be bonded suffers significant plastic deformation, the surface to be bonded becomes prone to undulations, dents, or other defects, and deteriorates in quality. For the connection terminals that were reduced in terminal width, therefore, there has been a limit to the effectiveness of the technique descried in Patent Reference 3.

Also, to apply an epoxy material or any other suitable adhesive, the step of applying the epoxy material and the step of curing the applied epoxy material are required, and a curing time of about 30 to 60 minutes is required in the curing step. In addition, since such a manufacturing method requires an application machine and curing equipment, there has been a problem in that costs are increased by a decrease in productivity. Furthermore, the space required for the application of the epoxy material has been lost by the tendency towards reduced connection terminal areas due to the further compactness and multifunctionality of connection terminals in recent years, and the above method has also had its limits.

SUMMARY OF THE INVENTION

One object of the present invention is to absorb and relieve the stress that the primary-molded article inserted into a molded part to be finally obtained suffers during resin shrinkage in multiple molding. More specifically, the invention is intended to provide an integrally multiple-molded part for electronic devices, capable of: preventing the occurrence of clearances between a bonding side face of an electrical connection terminal set and a molding resin in clearance-free contact with the bonding side face, by suppressing any actions of the stresses; obtaining stable frictional force at a contact region between a bonding surface of the electrical connection terminal set and an aluminum wire; thus obtaining the energy required for bonding; and ensuring high bondability.

Another object of the present invention is to provide an electronic device that can stably exchange electrical signals with outside by preventing the occurrence of clearances between an electrical connection terminal set and a molding resin in clearance-free contact with a bonding side face of the electrical connection terminal set, and obtaining a stable bond at a contact region between a bonding surface of the electrical connection terminal set and an aluminum wire.

A molded part according to the present invention includes: a first resin section having a first surface and a second surface opposed to the first surface; a second resin section bonded to the first resin section, at the second surface of the first resin section; and a metallic section inserted into the first resin section and exposed at the first surface of the first resin section; wherein a stress-absorbing structure is inserted within the first resin section.

Also, the stress-absorbing structure is a region whose bending rigidity is smaller than that of the first resin section.

In addition, the stress-absorbing structure is formed from a material having an elastic modulus smaller than that of the first resin section, and preferably, includes a rubber material or an elastomer material.

Furthermore, the stress-absorbing structure may have a recessed portion obtained by forming the first resin section into a recessed shape. Moreover, the recessed portion, although formed on the first surface or the second surface, may be provided on both of the two surfaces. A hole extending through the first and second surfaces can also be provided instead of the recessed portion.

An electronic device according to the present invention includes: a first resin section having a first surface and a second surface opposed to the first surface; a second resin section bonded to the first resin section, at the second surface of the first resin section; a plurality of electrical connection terminals each inserted into the first resin section and extending outward from the first resin section; a plurality of metallic contact surfaces each exposed at the first surface of the first resin section and electrically connected to each of the electrical connection terminals; an electronic component electrically connected from the plurality of metallic contact surfaces; and a circuit board with the electronic component disposed thereon; wherein a stress-absorbing structure is inserted within the first resin section.

Other features and characteristics of the present invention will be detailed later in the description of embodiments.

The molded part according to the present invention can absorb and relieve the stress that the primary-molded article inserted into a molded part to be finally obtained suffers during resin shrinkage in multiple molding.

Also, the electronic device according to the present invention can stably exchange electrical signals with outside by preventing the occurrence of clearances between an electrical connection terminal set and a molding resin and obtaining a stable bond at a contact region between a bonding surface of the electrical connection terminal set and an aluminum wire.

BRIEF DESCRIPTION OF THE DRAWINGS

Other objects and advantages of the invention will become apparent from the following description of embodiments with reference to the accompanying drawings in which.

DETAILED DESCRIPTION OF THE PREFERRED EMBODIMENTS

First Embodiment

A first embodiment of an integrally multiple-molded part for electronic devices, based on the present invention, is shown in FIGS. 1 to 7, 13 and 14. This integrally multiple-molded part for electronic devices, based on the first embodiment, is formed by primary molding from resin a plurality of electrical connection terminals for electrical connection to outside and then forming, in a primary-molding resin section of the article formed by the primary-molding operation, a stress-absorbing structure made from a low-elasticity material softer than the primary molding resin, such as a stress-absorbing rubber material or elastomer material.

Figure 1:
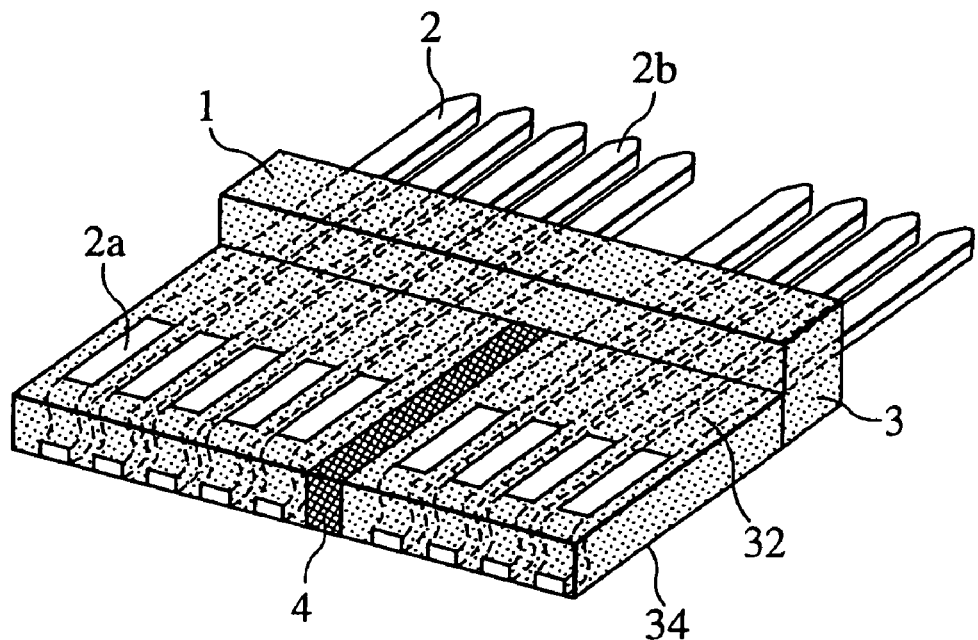
FIG. 1 is a perspective view of a primary-molded article after it has been formed in its primary-molding resin section by using a soft, low-elasticity material.
Figure 2:
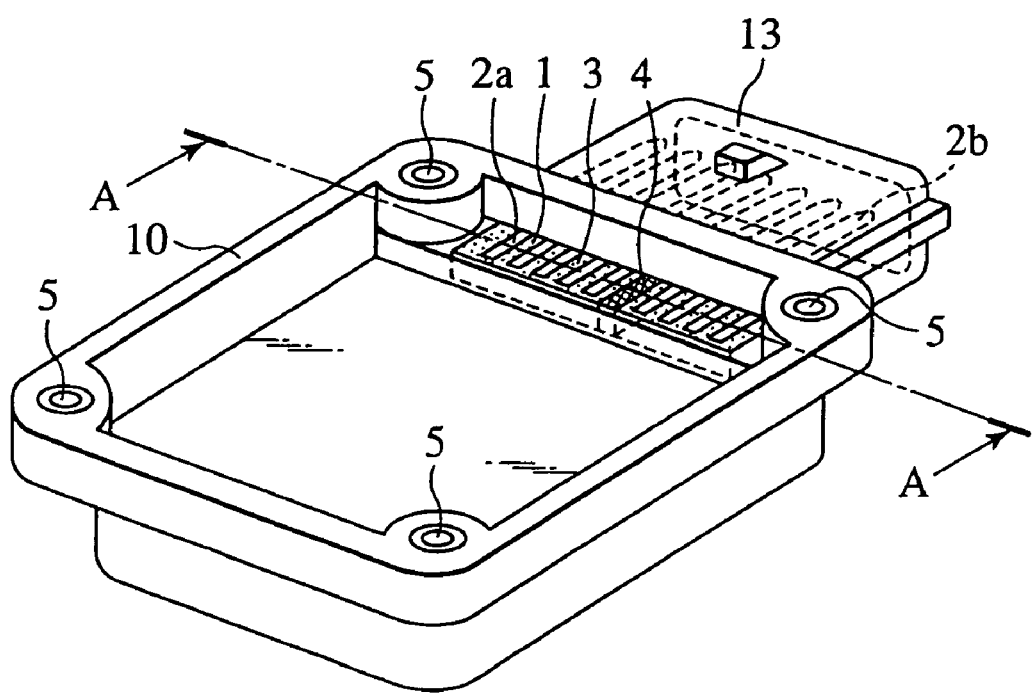
FIG. 2 is a perspective view showing a main body of the integrally multiple-molded part for electronic devices, obtained after insert-molding of the primary-molded article shown in FIG. 1.
Figure 3:
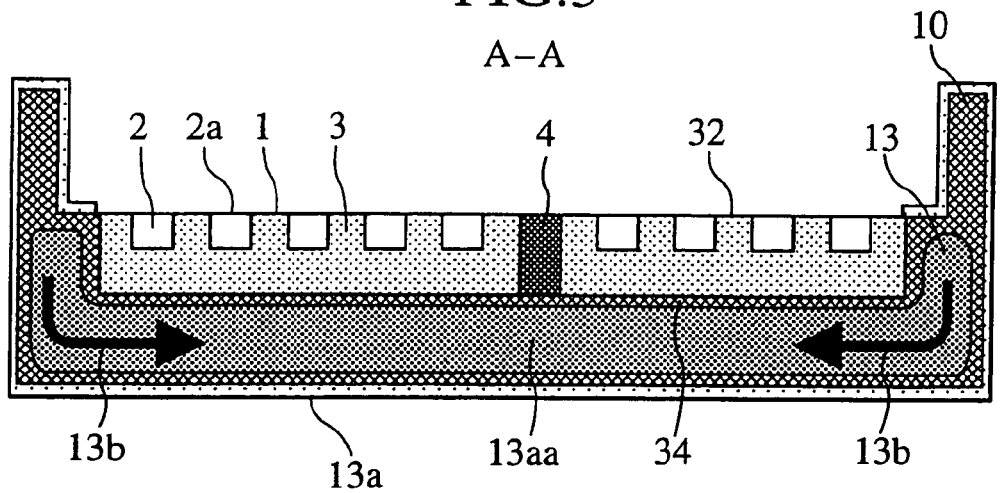
FIG. 3 is a cross-sectional view of the integrally multiple-molded part main body for electronic devices, taken along line A-A of FIG. 2.
Figure 4:
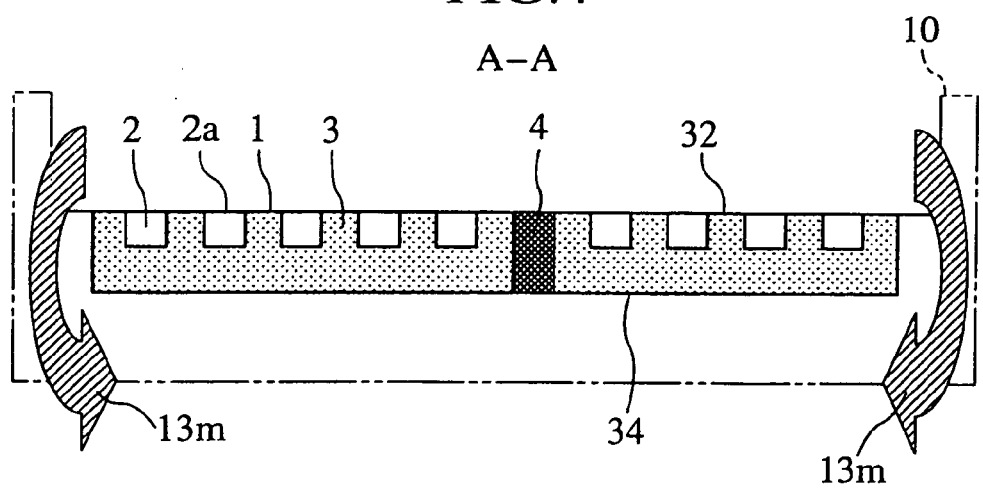
FIG. 4 is a cross-sectional view showing the moment applied to the primary-molded article, taken along line A-A of FIG. 2.
Figure 5:
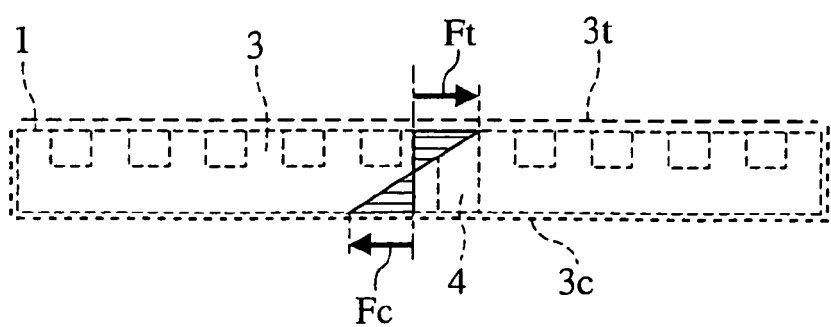
FIG. 5 is a cross-sectional view showing a schematic distribution state of the stresses occurring at a resin section of the primary-molded article, taken along line A-A of FIG. 2.
Figure 6:
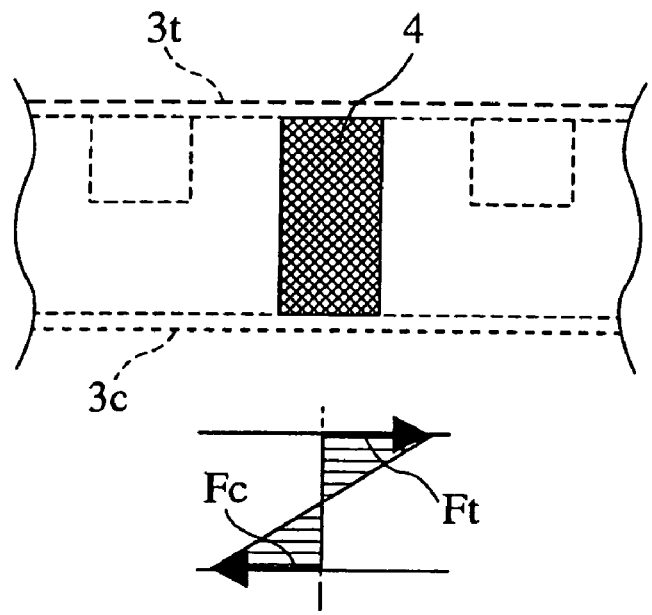
FIG. 6 is a cross-sectional view showing a schematic distribution state of the stresses occurring at the resin section before deformation of the low-elasticity material in the primary-molded article, taken along line A-A of FIG. 2.
Figure 7:
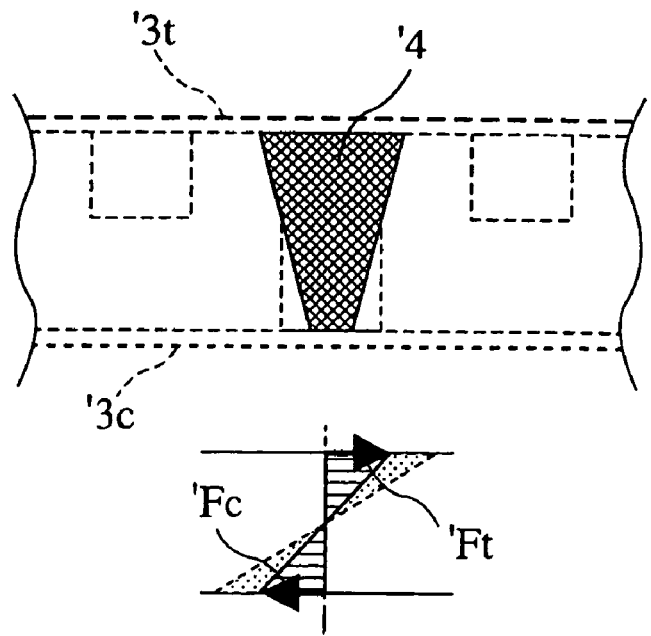
FIG. 7 is a cross-sectional view showing a schematic distribution state of the stresses occurring at the resin section after the deformation of the low-elasticity material in the primary-molded article, taken along line A-A of FIG. 2.
Figure 13:
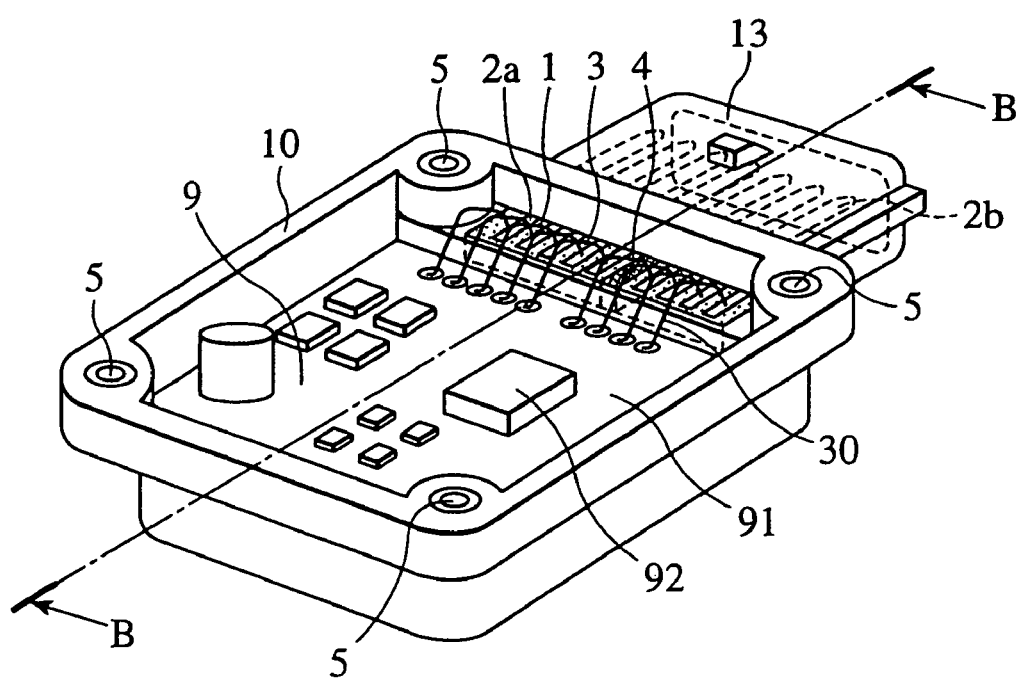
FIG. 13 is a perspective view of the integrally multiple-molded part main body of FIG. 2 that has an internally mounted electronic circuit.
Figure 14:
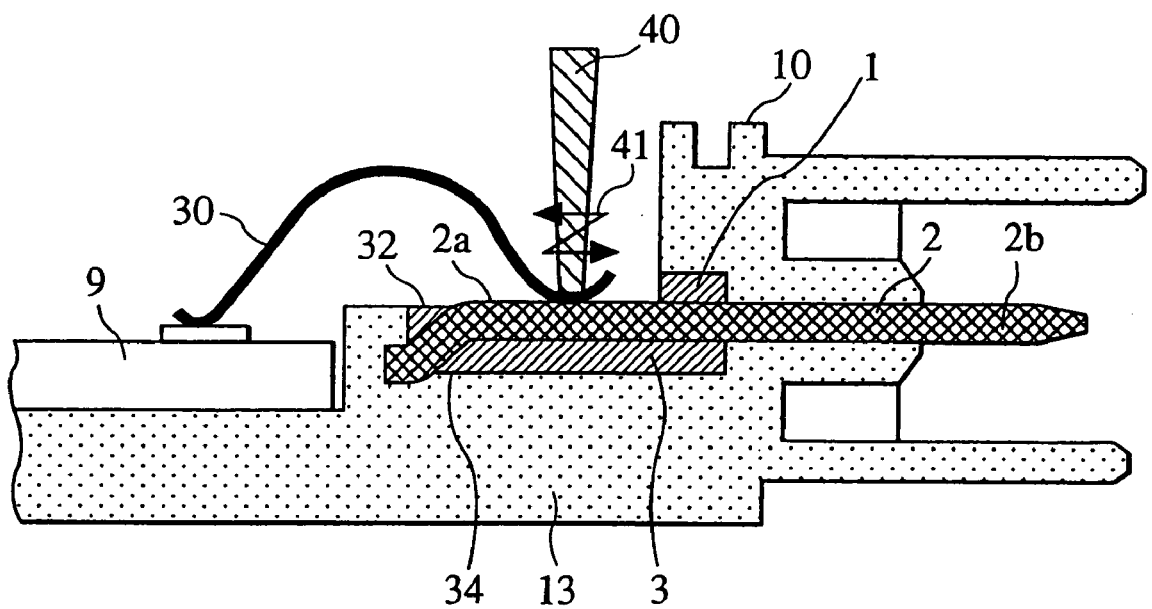
FIG. 14 is a cross-sectional view taken along line B-B of the primary-molded part main body of FIG. 13, showing a state in which an aluminum wire is bonded to electrical connection terminals.

FIG. 1 is a perspective view of the primary-molded article after it has been formed in its primary-molding resin section by using a soft, low-elasticity material. FIG. 2 is a perspective view showing a main body of the integrally multiple-molded part for electronic devices, obtained after insert-molding of the primary-molded article shown in FIG. 1. FIG. 3 is a cross-sectional view of the integrally multiple-molded part main body for electronic devices, taken along line A-A of FIG. 2. FIG. 4 is a cross-sectional view taken along line A-A of FIG. 2, showing the moment applied to the primary-molded article. FIG. 5 is a cross-sectional view taken along line A-A of FIG. 2, showing a schematic distribution state of the stresses occurring at a resin section of the primary-molded article. FIG. 6 is a sectional view taken along line A-A of FIG. 2, showing a schematic distribution state of the stresses occurring at the resin section before deformation of the low-elasticity material in the primary-molded article. FIG. 7 is a cross-sectional view taken along line A-A of FIG. 2, showing a schematic distribution state of the stresses occurring at the resin section after the deformation of the low-elasticity material in the primary-molded article. FIG. 13 is a perspective view of the integrally multiple-molded part main body of FIG. 2 that has an internally mounted electronic circuit. FIG. 14 is a cross-sectional view taken along line B-B of FIG. 13, showing a state in which an aluminum wire is bonded to electrical connection terminals of the molded part.

In FIG. 1, a primary-molded article 1 is formed by disposing a plurality of metal-made electrical connection terminals 2 in parallel as an insert, then further forming a low-elasticity material (stress-absorbing structure) 4 softer than a primary molding resin (first resin section) 3, such as a rubber material or an elastomer material, centrally in the parallel disposition of the above plural metal-made electrical connection terminals 2 and in the same direction of disposition as that of the connection terminals 2, and integrally constructing the connection terminals 2 and the low-elasticity material 4 by use of the primary molding resin 3. The primary molding resin 3 constituting the primary-molded article 1 is constructed of a polybutylene terephthalate (PBT) resin containing a 30%-40% glass filler, and includes a first surface 32 and a second surface 34 opposed thereto. In order to establish electrical connection to outside, each of the electrical connection terminals 2 has a contact surface 2b and a bonding surface (metallic section) 2a, both of which are exposed from the surface (first surface 32) of the primary molding resin 3.

In the present embodiment, the low-elasticity material (stress-absorbing structure) 4 is inserted in such a form as to extend through the first surface 32 and the second surface 34. However, the present invention is not limited to this form of insertion. For example, the low-elasticity material 4 may be inserted into a recess-shaped hole formed in the first surface 32 or may be inserted into a recess-shaped hole formed in the second surface 34. Otherwise, the low-elasticity material 4 may be inserted into recess-shaped holes provided in both the first surface 32 and the second surface 34.

The integrally multiple-molded part main body 10 for electronic devices, shown in FIG. 2, is constructed by inserting the above-mentioned primary-molded article 1 as an insert article, and then integrally conducting secondary molding with a secondary molding resin (second resin section) 13. The secondary molding resin 13 constituting the molded part main body 10 is constructed of a PBT resin containing a 30%-40% glass filler. Also, a bushing 5 for installing the molded part main body 10 is inserted into each of four corners thereof. As shown in FIG. 2, the molded part main body 10 has three exposed surfaces at its internal surface formed into a box shape. These exposed surfaces refer to the bonding surface 2a of the primary-molded article 1, one surface (first surface 32) of the primary molding resin 3 that becomes the same surface as the bonding surface 2a, and one surface of the low-elasticity material 4. The second surface 34 opposed to the first surface 32 of the primary molding resin 3 is in contact with the secondary molding resin 13.

In FIG. 13, inside the integrally multiple-molded part main body 10 for electronic devices that is formed into a box shape, a control circuit 9 with an electronic component 92 mounted on a circuit board 91 is disposed in a process step separate from that of the molded part main body 10.

The electrical connection terminals 2 that were formed in the molded part main body 10 by repeating insert-molding a plurality of times have a bonding surface (metallic contact surface) 2a adapted to bond an aluminum wire 30. The bonding surface 2a is a wire-bonding section in which the bonding of the aluminum wire 30 to the control circuit 9 mounted in the molded part main body 10 is to be conducted for electrical connection. In this manner, the control circuit 9 and the bonding surface 2a of the electrical connection terminals 2 are bonded via the aluminum wire 30, whereby an electronic control device is constructed.

The secondary molding resin 13 constituting the molded part main body 10 shown in FIG. 2 shrinks during a process step in which the resin 13 is solidified from a molten resin state, and the resin shrinkage compresses the primary-molded article 1 serving as a path for stress transmission. The bonding surface 2a of the primary-molded part article 1 that is exposed from the internal surface of the molded part main body 10, and the same surface of the bonding surface 2a do not come into contact with the secondary molding resin 13. The bonding surface 2a and the same surface of the bonding surface 2a, therefore, are not easily affected by transmission of stresses due to the resin shrinkage. Detectivity of the resin shrinkage is shown in FIG. 3, a cross-sectional view taken along line A-A.

The resin shrinkage is described in detail below. Solidification of the molten resin from a surface layer 13a thereof, towards a resin interior 13aa, begins immediately after resin filling, and shrinkage 13b of the resin in the same direction as a direction in which the solidification progresses, is started simultaneously with the solidification. The secondary molding resin 13 on the lower-face side of the primary-molded article 1 that comes into contact with the secondary molding resin 13 in FIG. 3 undergoes compressive stresses during the shrinkage of the secondary molding resin 13. In FIG. 3, the bonding surface 2a of the primary-molded part article 1 that becomes as an upper-face side not coming into contact with the secondary molding resin 13, and the same surface as the bonding surface 2a, are not easily affected by the transmission of stresses due to the shrinkage of the secondary molding resin 13. A difference between the stresses acting on the upper-face side and on the lower-face side causes such bending moment 13m in an exposed region of the primary-molded article 1 that deflects the exposed surface side thereof into a convex shape as shown in FIG. 4.

The bending moment 13m that deflects the exposed surface side of the primary-molded article 1 into a convex shape causes a stress distribution of compressive force Fc and tensile force Ft to occur in the primary molding resin 3, as shown in FIG. 5. As stresses arise from the compressive force Fc and the tensile force Ft, the soft low-elasticity material 4 formed in the primary-molded article 1 deforms as shown in FIGS. 6 and 7, and absorbs secondary-molding resin shrinkage. Internal stresses of the primary molding resin 3 are reduced along with the absorption. These reductions are shown as changes in compressive force 'Fc and tensile force 'Ft. Thus, the tensile stresses occurring on the exposed bonding surface 2a of the primary-molded article 1 that faces the internal surface of the integrally multiple-molded part main body 10, and on the primary molding resin 3 that becomes the same surface as the bonding surface 2a, can be relieved in the molded part main body 10.

Relieving the stress 'Ft in FIG. 7 makes it possible to prevent formation of clearances liable to occur between a side face of the bonding surface 2a of the electrical connection terminals 2 and the primary molding resin 3 adjacent to the side face of the bonding surface 2a.

A mechanism of bonding via the aluminum wire 30 will be described below using FIG. 14.

In FIG. 14, the aluminum wire 30 is set up at an upper portion of the bonding surface 2a of each electrical connection terminal 2. Also, a bonding horn 40 of a bonding machine is placed vertically to the bonding surface 2a of the electrical connection terminals 2, at an upper portion of the aluminum wire 30. The configuration shown in FIG. 14 is adapted to apply ultrasonic vibration 41 from the bonding machine through the bonding horn 40 to the upper portion of the aluminum wire 30. Therefore, the primary molding resin 3 and the electrical connection terminal 2, the bonding surface 2a and the aluminum wire 30 (contact width of the bonding horn 40), and the aluminum wire 30 (contact width of the bonding horn 40) and the bonding horn 40 (contact width of the bonding horn 40) are in mutual contact without a clearance.

Next, wire bonding is described below. During application of a constant load via the bonding horn 40, when an ultrasonic signal is applied from the bonding machine to the bonding horn 40, the bonding horn 40 causes ultrasonic vibration 41 and generates frictional force at a contact region between the bonding surface 2a of the electrical connection terminal 2 and the aluminum wire 30 (contact width of the bonding horn 40). The frictional force becomes bonding energy and provides a bond between the bonding surface 2a and the aluminum wire 30.

Figure 9:
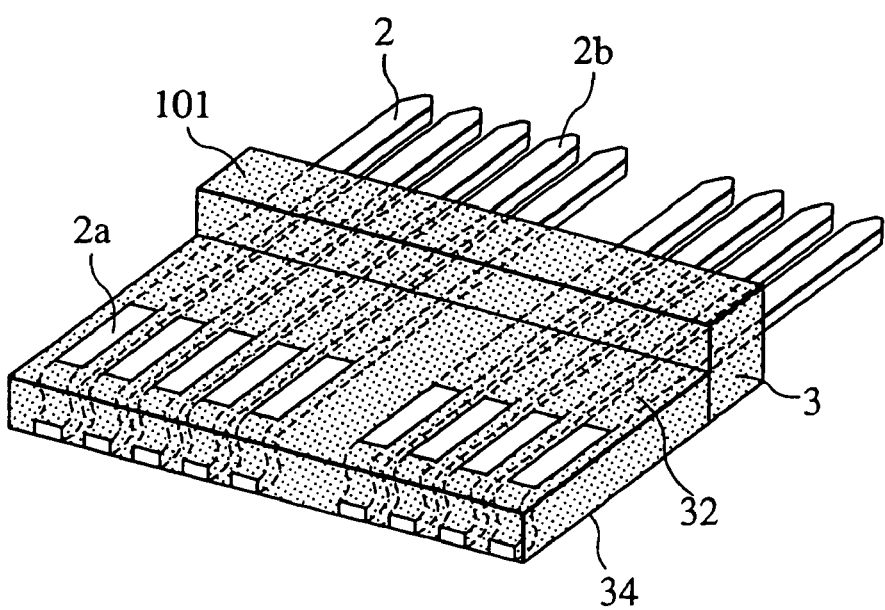
FIG. 9 is a perspective view of a primary-molded article not having a soft material formed in a primary-molding resin section of the primary-molded article.
Figure 10:
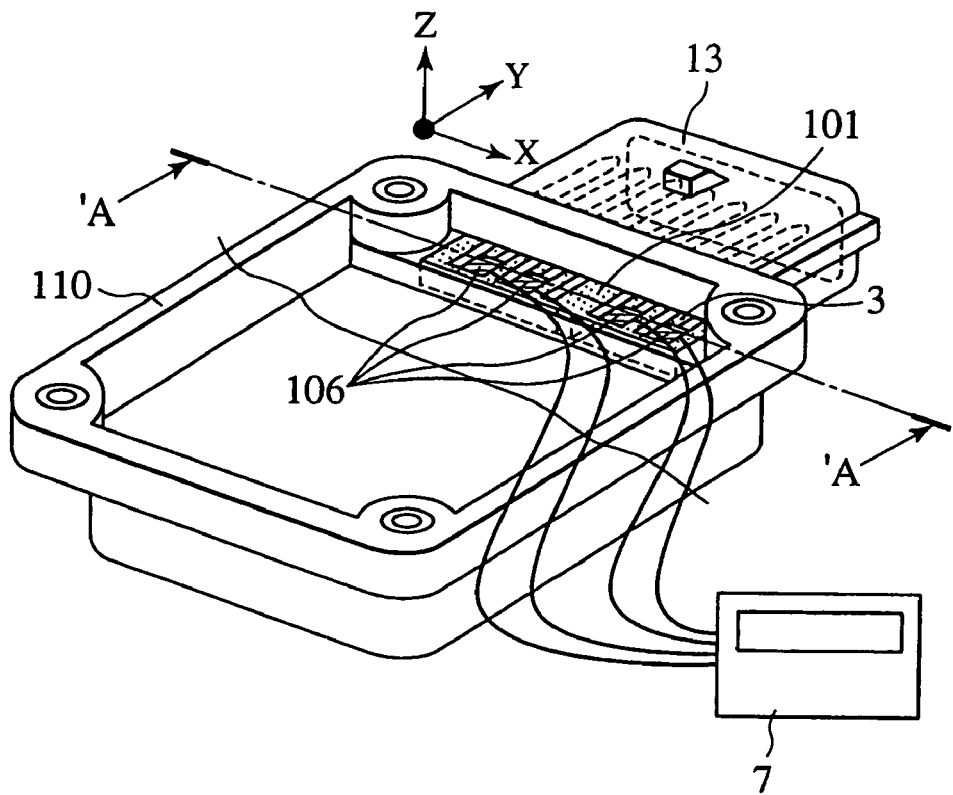
FIG. 10 is a perspective view that explains resin surface strain measurement in the integrally multiple-molded part main body for electronic devices, shown in FIG. 9.
Figure 12:
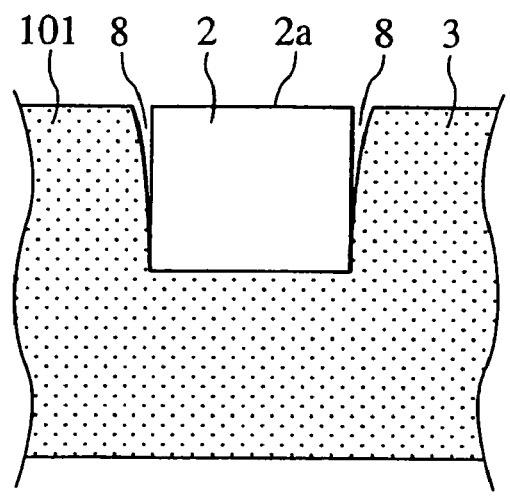
FIG. 12 is a partial cross-sectional view of an electrical connection terminal in the primary-molded article, taken along line 'A-'A of FIG. 10.

Traditionally, the integrally multiple-molded part 110 of FIG. 10 is constructed by insert-molding the primary-molded article 101 of FIG. 9 that does not have a stress-absorbing structure in the primary molding resin 3 of the primary-molded article 101. In this case, a tensile stress in an 'A-'A direction inside the primary molding resin 3 is great and as shown in FIG. 12, this stress acts to pull the surfaces of both the side face of the bonding surface 2a of the electrical connection terminal 2 and the primary molding resin 3 adjacent to the side face of the bonding surface 2a. Since the retaining force holding the electrical connection terminal 2 from both left and right sides is consequently lost, the primary molding resin 3 is pulled away from the side face of the bonding surface 2a. This causes a clearance 8 between the side face of the bonding surface 2a and the primary molding resin 3, thus resulting in the so-called "rattling." When the electrical connection terminals 2 and the aluminum wire 30 are bonded together, therefore, if a bonding horn 40 and the electrical connection terminals 2 move in coordination form, the resulting absorption of the ultrasonic vibration reduces the frictional force at the contact region between the bonding surface 2a and the aluminum wire 30. The energy required for bonding cannot be obtained as a result.

For the integrally multiple-molded part 10 in the present embodiment, however, a pattern such as that of 'Ft in FIG. 7 can be produced by relieving stresses to prevent the formation of clearances liable to occur between the side face of the bonding surface 2a of the electrical connection terminal 2 and the primary molding resin 3 adjacent to the side face of the bonding surface 2a. During bonding between the electrical connection terminals 2 and the aluminum wire 30, therefore, it is possible to obtain stable frictional force at the contact region between the bonding surface 2a of the electrical connection terminal 2 and the aluminum wire 30, and thus to obtain the energy required for bonding and ensure high bondability.

Figure 8:
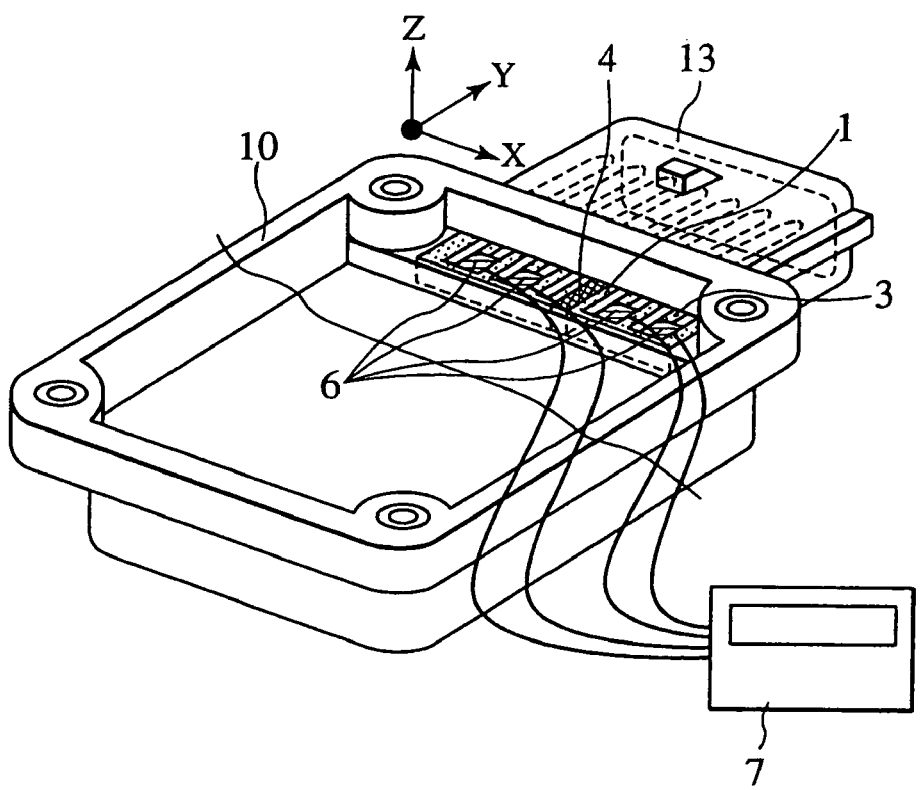
FIG. 8 is a perspective view that explains resin surface strain measurement in the integrally multiple-molded part main body for electronic devices, shown in FIG. 2.

In order to confirm such a stress-relieving action, as shown in FIG. 8, several strain gauges 6 were affixed to such a surface of the primary molding resin 3 as becoming the same surface as the bonding surface 2a of the primary-molded article 1 that was exposed at the internal surface of the integrally multiple-molded part 10 of the present embodiment, and strain measurements with a strain-measuring instrument 7 were conducted using the molded part 10. As shown in FIG. 8, the strain gauges 6 were arranged on the same line in order for a measuring direction of strain to agree with an A-A direction of occurrence of the stresses that cause clearances at the side face of the electrical connection terminal 2.

Prior to the strain measurements, the strain gauges 6 were affixed to the surface of the primary molding resin 3 under a normal-temperature environment and then the strain-measuring instrument 7 was zero-adjusted. After this, all the secondary molding resin 13 of the molded article 10 that was in contact with the primary molding resin 3 was separated to be in an independent state free from any constraint force applied from the primary molding resin 3. After several minutes, strain values of the strain gauges 6 affixed to the surface of the separated primary molding resin 3 were measured.

The integrally multiple-molded part 10 in the present embodiment was compared with the integrally multiple-molded part 110 of FIG. 10 that was constructed by insert-molding the primary-molded article 101 which, as shown in FIG. 9, did not have a stress-absorbing structure in the primary molding resin 3 of the primary-molded article 101. As shown in FIG. 10, strain was measured in the same direction as, and at the same locations as, those of FIG. 8. A measuring method was also the same as that described above. That is, strain gauges 106 were affixed to the surface of the primary molding resin 3 under a normal-temperature environment and then a strain-measuring instrument was zero-adjusted. After this, all the secondary molding resin 13 of the molded article 110 that was in contact with the primary molding resin 3 was separated to be in an independent state free from any constraint force applied from the primary molding resin 3. After several minutes, strain values of the strain gauges 106 affixed to the surface of the separated primary molding resin 3 were measured.

Figure 11:
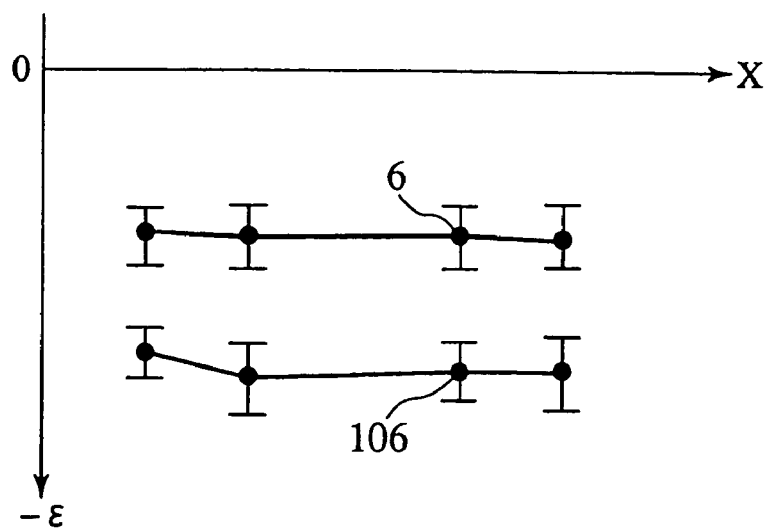
FIG. 11 shows surface strain measurement results on the primary molding resin used in the integrally multiple-molded part main body for electronic devices, shown in FIGS. 2 and 9.

Measurement results are shown in FIG. 11. The strain data measurements shown in FIG. 11 are negative data, which indicates that the primary molding resin, after being totally separated from the secondary molding resin of the molded part, has been freed from an elongated state by loss of constraint force and contracted to restore an original state. That is, the negative data in FIG. 11 indicates that in a multiple-molded state of the integrally molded part, the tensile stresses that were applied from the secondary molding resin of the molded part are occurring on the primary-molding resin surface. A larger absolute data measurement means a greater tensile stress on the primary-molding resin surface in the molded part. It was confirmed in FIG. 11, therefore, that the data obtained using the strain gauges 6 affixed to the integrally multiple-molded part 10 in the present embodiment is reduced to substantially ½ of the data obtained from the strain gauges 106 affixed to the molded part 110 in the conventional technique. It was verified from these measurement results that the low-elasticity material 4 formed in the primary-molded article 1 of the integrally multiple-molded part 10 in the present embodiment becomes deformed by absorbing the shrinkage of the secondary molding resin and acts to reduce internal stresses of the primary molding resin 3, except in deformed low-elasticity material '4.

These verification results on internal stress reduction indicate that using also the integrally multiple-molded part of the present embodiment makes it possible to prevent the formation of clearances liable to occur between the bonding side face of the electrical connection terminal and the primary molding resin adjacent to the bonding side face. Therefore, particularly during bonding between the electrical connection terminals and the aluminum wire, the above method is effective in obtaining stable frictional force at the contact region between the bonding surface of the electrical connection terminals and the aluminum wire, and thus in obtaining the bonding energy required and achieving high bondability.

While the primary molding resin 3 and resin 13 in the above-described first embodiment has used the PBT resin containing a 30%-40% gas filler, the kind of insert-molding resin material is not limited to a PBT resin. It is possible to use, as an alternative, a thermoplastic resin, a thermosetting resin, or a thermoplastic or thermosetting resin containing a filler made from glass fibers of an inorganic material or from fibers of an organic material.

In addition, while the first embodiment using the low-elasticity material 4 as a stress-absorbing structure has been described, the present invention is not limited to this kind of material and an equivalent structure can also be formed using a member whose bending rigidity is smaller than the primary molding resin 3.

The molded part according to the first embodiment of the present invention is adapted to absorb and relieve the stresses that the primary-molded article inserted into a molded part suffers during resin shrinkage in multiple molding. It is therefore possible to prevent the occurrence of clearances between a bonding side face of each electrical connection terminal and the molding resin in clearance-free contact with the bonding side face, by suppressing any actions of the stresses. It is consequently possible to obtain stable frictional force at a contact region between a bonding surface of the electrical connection terminal and an aluminum wire, and thus to obtain the bonding energy required and ensure high bondability.

The electronic device according to the first embodiment of the present invention can stably exchange electrical signals with outside by preventing the occurrence of clearances between an electrical connection terminal set and a molding resin and obtaining a stable bond at the contact region between a bonding surface of the electrical connection terminal set and an aluminum wire.

Second Embodiment

A second embodiment of an integrally multiple-molded part for electronic devices, based on the present invention, is shown in FIGS. 15 to 21. The same sections as those of the first embodiment are not described below.

In this second embodiment of an integrally multiple-molded part for electronic devices, a plurality of terminals for electrical connection to outside are an article formed by primary molding from resin. Also, a portion that has a small cross-sectional area in a primary-molding resin section of the primary-molded article and easily deforms is formed as a stress-absorbing structure in the primary-molding resin section of the primary-molded article, and more particularly, a recessed portion 52 is provided on the surface of a mold for primary molding.

Figure 15:
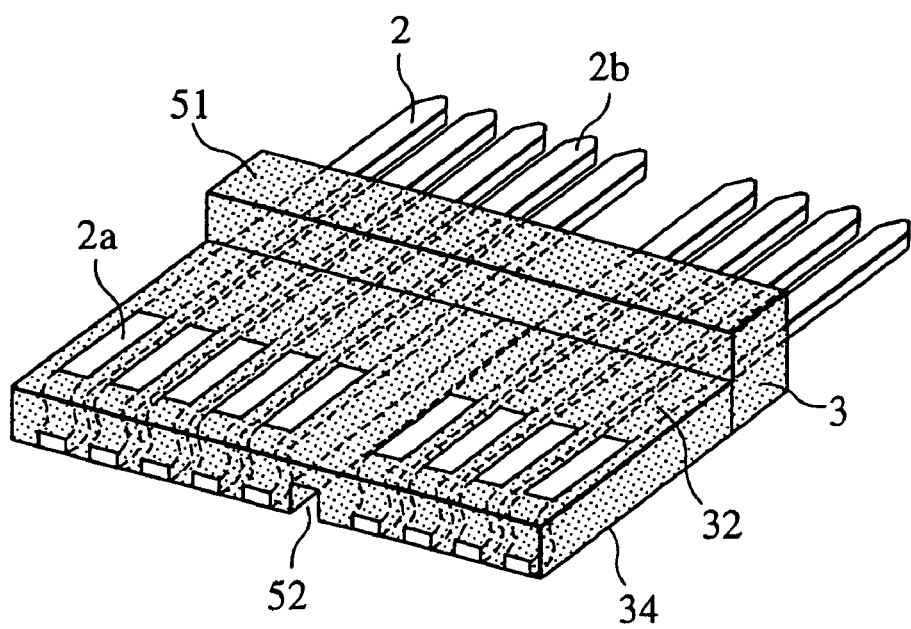
FIG. 15 is a perspective view of a primary-molded article after a recessed portion has been formed in a primary-molding resin section of the primary-molded article.
Figure 16:
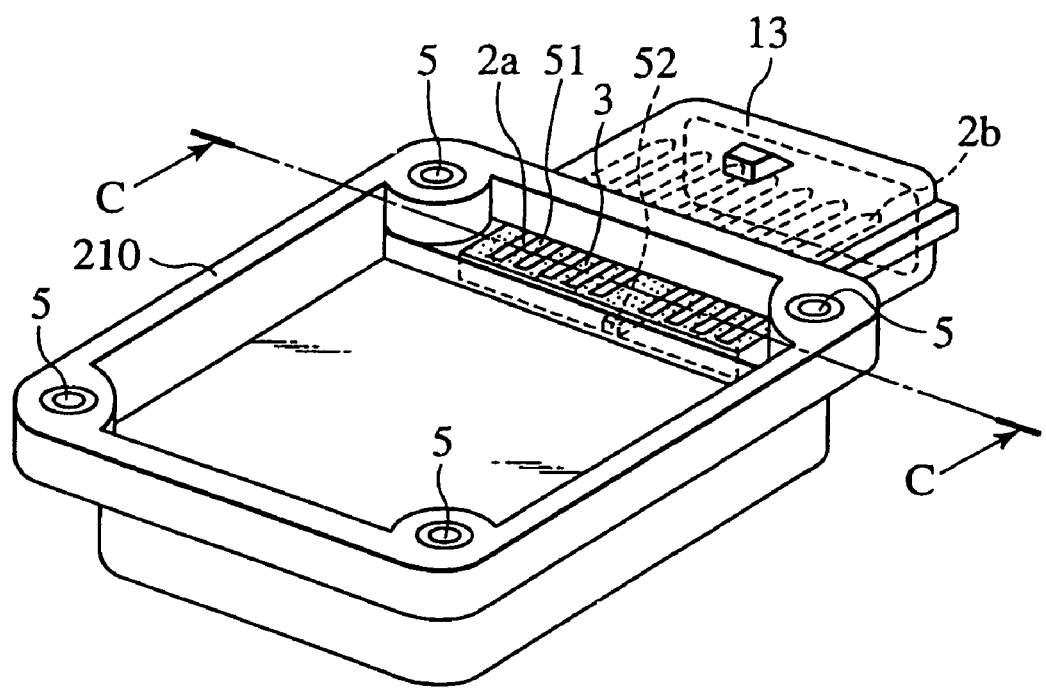
FIG. 16 is a perspective view showing a main body of the integrally multiple-molded part for electronic devices, obtained after insert-molding of the primary-molded article shown in FIG. 15.
Figure 17:
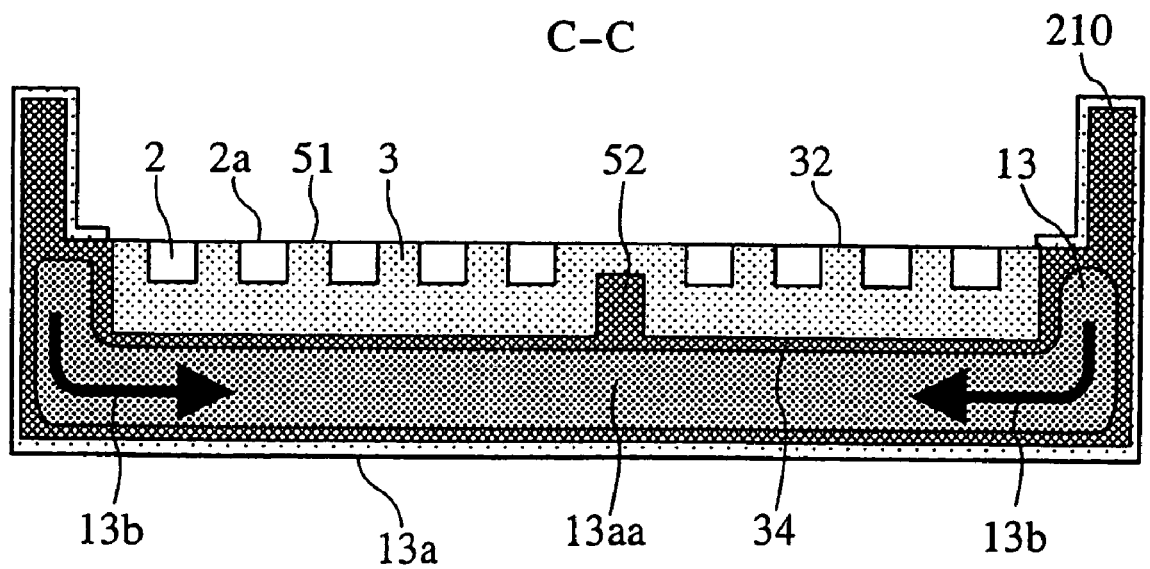
FIG. 17 is a cross-sectional view of the integrally multiple-molded part main body for electronic devices, taken along line C-C of FIG. 16.
Figure 18:
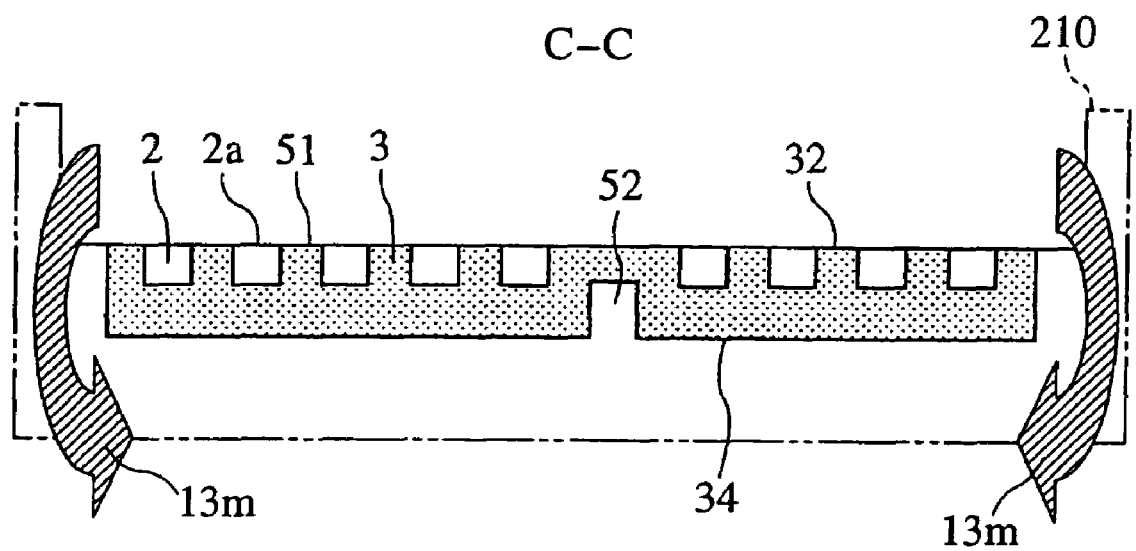
FIG. 18 is a cross-sectional view taken along line C-C of FIG. 16, showing the moment applied to the primary-molded article.
Figure 19:
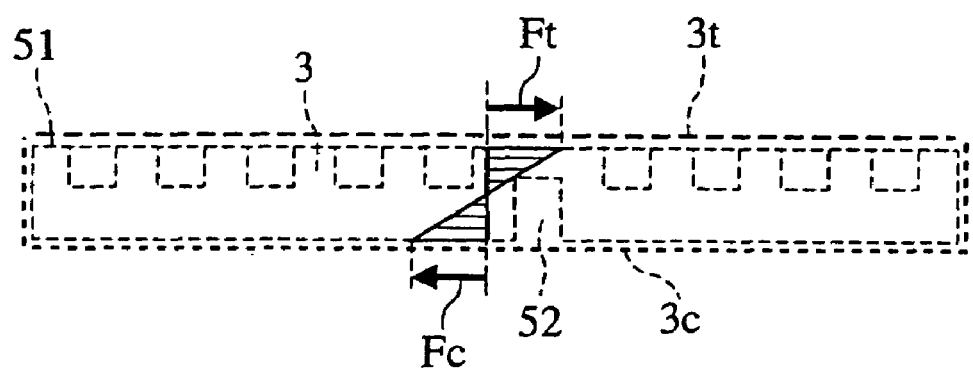
FIG. 19 is a cross-sectional view taken along line C-C of FIG. 16, showing a distribution state of the stresses occurring in the primary-molded article.
Figure 20:
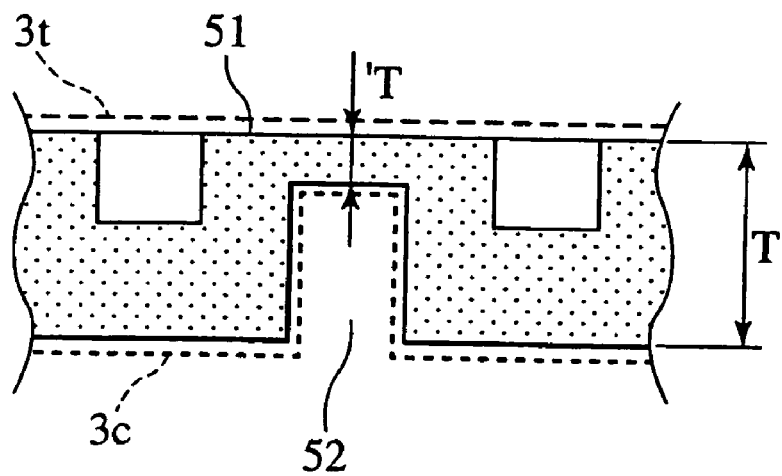
FIG. 20 is a partial cross-sectional view taken along line C-C at the recessed portion of the primary-molded article shown in FIG. 16.
Figure 21:
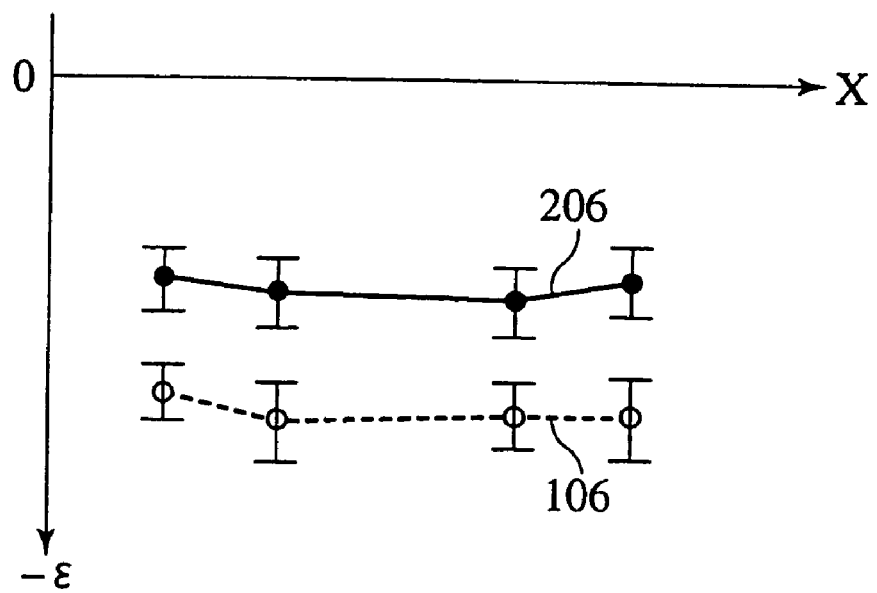
FIG. 21 shows surface strain measurement results on the primary molding resin of the integrally multiple-molded part main body shown in FIG. 16.

FIG. 15 is a perspective view of the primary-molded article after a recessed portion has been formed in the primary-molding resin section of the primary-molded article. FIG. 16 is a perspective view showing a main body of the integrally multiple-molded part for electronic devices, obtained after insert-molding of the primary-molded article shown in FIG. 15. FIG. 17 is a cross-sectional view of the integrally multiple-molded part main body for electronic devices, taken along line C-C of FIG. 16. FIG. 18 is a cross-sectional view taken along line C-C of FIG. 16, showing the moment applied to the primary-molded article. FIG. 19 is a cross-sectional view taken along line C-C of FIG. 16, showing a schematic distribution state of the stresses occurring in the primary-molded article. FIG. 20 is a partial sectional view taken along line C-C at the recessed portion of the primary-molded article shown in FIG. 16. FIG. 21 shows surface strain measurement results on the primary molding resin of the integrally multiple-molded part main body shown in FIG. 16.

In FIG. 15, a primary-molded article 51 is formed by regularly arranging a plurality of metal-made electrical connection terminals 2 in parallel as an insert article, then further forming from a primary molding resin (first resin section) 3 a recessed portion 52 with a small cross-sectional area in the molding resin section, centrally in the parallel arrangement of the above plural metal-made electrical connection terminals 2, in such a way as to orient the recessed portion 52 in parallel to the arrangement of the electrical connection terminals 2 and in an opposite direction to an exposed surface of each electrical connection terminal 2, and integrally constructing the electrical connection terminal 2 and the recessed portion 52 by use of the primary molding resin 3. The recessed portion 52 is formed so that the primary molding resin 3 is thinner than all other portions thereof, except at the recessed portion 52, with respect to a vertical direction of the exposed surface of the electrical connection terminal 2, and so that the recessed portion 52 has a shape which is small in cross-sectional area in the molding resin section and permits the recessed portion 52 to easily deform. The primary molding resin 3 constituting the primary-molded article 51 is constructed of a PBT resin containing a 30%-40% glass filler. In order to establish electrical connection to outside, each of the electrical connection terminals 2 has a contact surface 2b and a bonding surface (metallic section) 2a, both of which are exposed from the surface of the primary molding resin 3.

The integrally multiple-molded part main body 210 for electronic devices, shown in FIG. 16, is constructed by inserting the above-mentioned primary-molded article 51 as an insert article, and then integrally conducting secondary molding with a secondary molding resin (second resin section) 13. The secondary molding resin 13 constituting the molded part main body 210 is constructed of a PBT resin containing a 30%-40% glass filler. Also, a bushing 5 for installing the molded part main body 210 is inserted into each of four corners thereof. In FIG. 16, the molded part main body 210 has two exposed surfaces at its internal surface formed into a box shape. These exposed surfaces refer to the bonding surface 2a of the primary-molded article 51 and one surface of the primary molding resin 3 that becomes the same surface of the bonding surface 2a.

As in FIG. 13, inside the integrally multiple-molded part main body 210 for electronic devices that is formed into a box shape, a control circuit with an electronic component mounted thereon is composed in a process step separate from that of the molded part main body 210.

The electrical connection terminals 2 that were formed in the molded part main body 210 by repeating insert-molding a plurality of times have the bonding surface 2a formed to bond an aluminum wire. The bonding surface 2a is a wire-bonding section in which the bonding of the aluminum wire to the control circuit mounted in the molded part main body 210 is to be conducted for electrical connection. In this manner, the control circuit and the bonding surface 2a of each electrical connection terminal 2 are bonded via the aluminum wire, whereby an electronic control device is constructed.

The secondary molding resin 13 constituting the molded part main body 210 shown in FIG. 16 shrinks during a process step in which the resin 13 is solidified from a molten resin state, and the resin shrinkage compresses the primary-molded article 51 serving as a path for stress transmission. The bonding surface 2a of the primary-molded part article 51 that is exposed from the internal surface of the molded part main body 210, and the same surface of the bonding surface 2a do not come into contact with the secondary molding resin 13. The bonding surface 2a and the same surface of the bonding surface 2a, therefore, are not easily affected by transmission of stresses due to the resin shrinkage. Detectivity of the resin shrinkage is shown in FIG. 17, a cross-sectional view taken along line C-C.

The resin shrinkage is described in detail below. Solidification of the molten resin from a surface layer 13a thereof, towards a resin interior 13aa, begins immediately after resin filling, and shrinkage 13b of the resin in the same direction as a direction in which the solidification progresses, is started simultaneously with the solidification. The secondary molding resin 13 on the lower-face side of the primary-molded article 51 that comes into contact with the secondary molding resin 13 in FIG. 17 undergoes compressive stresses during the shrinkage of the secondary molding resin 13. In FIG. 17, the bonding surface 2a of the primary-molded part article 51 that becomes as an upper-face side not coming into contact with the secondary molding resin 13, and one surface of the primary molding resin 3 that becomes the same surface as the bonding surface 2a, are not easily affected by the transmission of stresses due to the shrinkage of the secondary molding resin 13. A difference between the stresses acting on the upper-face side and on the lower-face side causes such bending moment 13m on an exposed surface side of the primary-molded article 51 that deflects the exposed surface side into a convex shape as shown in FIG. 18. The bending moment 13m that deflects the exposed surface side of the primary-molded article 51 into a convex shape causes stresses due to compressive force Fc and tensile force Ft to occur in the primary molding resin 3, as shown in FIG. 19. As shown in FIG. 20, the recessed portion 52 in the primary-molded article 51 is formed so that thickness 'T of the primary molding resin 3 is smaller than thickness T thereof, except at the recessed portion 52, with respect to the vertical direction of the exposed surface of the electrical connection terminal 2, and so that the recessed portion 52 has a small cross-sectional area in the molding resin section. Even when stresses arise from the compressive force Fc and the tensile force Ft, therefore, the recessed portion 52 easily deforms, which means that the cross-sectional coefficient of the recessed portion 52 that is associated with a direction in which the moment 13m in FIG. 18 acts is low, and thus that the recessed portion 52, compared with other portions of the primary molding resin 3, is prone to bending deformation. Accordingly, the recessed portion 52 absorbs the shrinkage of the secondary molding resin 13 by becoming deformed, and internal stresses of the primary molding resin 3, except at the deformed recessed portion 52, are reduced. Thus, the tensile stresses occurring on the exposed bonding surface 2a of the primary-molded article 51 that faces the internal surface of the integrally multiple-molded part main body 210, and on the primary molding resin 3 that becomes the same surface as the bonding surface 2a, can be relieved in the molded part main body 210.

Relieving the above stresses makes it possible to prevent formation of clearances liable to occur between a side face of the bonding surface 2a of each electrical connection terminal 2 and the primary molding resin 3 adjacent to the side face of the bonding surface 2a.

Similarly to the first embodiment, a mechanism of aluminum wire bonding in the integrally multiple-molded part 210 for electronic devices, formed by inserting the above-constructed primary-molded article 51 into a molded part and then integrally constructing the primary-molded article 51 and the molded part, will be as shown in FIG. 14.

For the integrally multiple-molded part 210 in the present embodiment, as described above, the formation of clearances liable to occur between the side face of the bonding surface 2a of the electrical connection terminal 2 and the primary molding resin 3 adjacent to the side face of the bonding surface 2a can be prevented by relieving the tensile stresses occurring in a C-C direction on the surface of the primary-molded article 51. Hence, it is possible to obtain stable frictional force at a contact region between the bonding surface 2a of the electrical connection terminal 2 and the aluminum wire, and thus to obtain the energy required for bonding and ensure high bondability.

In order to confirm such a stress-relieving action, similarly to the state shown in FIG. 8 for the first embodiment, several strain gauges 206 were affixed to such surface of the primary molding resin 3 as becoming the same surface as the bonding surface 2a of the primary-molded article 51 that was exposed at the internal surface of the integrally multiple-molded part 210 of the present embodiment, and strain measurements with a strain-measuring instrument 7 were conducted using the molded part 210. Strain was measured with the strain gauges 206 arranged linearly in a direction diagonal to that of orientation of the electrical connection terminals 2, as shown in FIG. 8.

Prior to the strain measurements, the strain gauges 206 were affixed to the surface of the primary molding resin 3 under a normal-temperature environment and then the strain-measuring instrument 7 was zero-adjusted. After this, all the secondary molding resin 13 of the molded article 210 that was in contact with the primary molding resin 3 was separated to be in an independent state free from any constraint force applied from the primary molding resin 3. After several minutes, strain values of the strain gauges 206 affixed to the surface of the separated primary molding resin 3 were measured.

The integrally multiple-molded part 210 in the present embodiment was compared with the integrally multiple-molded part 110 of FIG. 10 that was constructed by insert-molding the primary-molded article 101 which, as shown in FIG. 9, did not have a stress-absorbing structure in the primary molding resin 3 of the primary-molded article 101. Strain was measured in the same direction as, and at the same locations as, those of FIG. 8. A measuring method was also the same as that described above. That is, strain gauges 106 were affixed to the surface of the primary molding resin 3 under a normal-temperature environment and then a strain-measuring instrument was zero-adjusted. After this, all the secondary molding resin 13 of the molded article 110 that was in contact with the primary molding resin 3 was separated to be in an independent state free from any constraint force applied from the primary molding resin 3. After several minutes, strain values of the strain gauges 106 affixed to the surface of the separated primary molding resin 3 were measured.

Measurement results are shown in FIG. 21. The strain data measurements shown in FIG. 21 are negative data, which indicates that the primary molding resin, after being totally separated from the secondary molding resin of the molded part, has been freed from an elongated state by loss of constraint force and contracted to restore an original state. That is, the negative data in FIG. 21 indicates that in a multiple-molded state of the integrally molded part, the tensile stresses that were applied from the secondary molding resin of the molded part are occurring on the primary-molding resin surface. A larger absolute data measurement means a greater tensile stress on the primary-molding resin surface in the molded part. It was confirmed in FIG. 21, therefore, that the data obtained using the strain gauges 206 affixed to the integrally multiple-molded part 210 in the present embodiment is reduced to substantially ½ of the data obtained from the strain gauges 106 affixed to the molded part 110 in the conventional technique. It was verified from these measurement results that the recessed portion 52 formed in the primary-molded article 51 of the integrally multiple-molded part 210 in the present embodiment acts to reduce internal stresses of the primary molding resin 3.

These verification results on internal stress reduction indicate that similarly to the first embodiment, using also the integrally multiple-molded part of the present embodiment makes it possible to prevent the formation of clearances liable to occur between the bonding side face of the electrical connection terminal and the primary molding resin adjacent to the bonding side face. Therefore, particularly during bonding between the electrical connection terminals and the aluminum wire, the above method is effective in obtaining stable frictional force at the contact region between the bonding surface of the electrical connection terminals and the aluminum wire, and thus in obtaining the bonding energy required and achieving high bondability.

While the primary molding resin 3 and resin 13 in the above-described second embodiment has used the PBT resin containing a 30%-40% gas filler, the kind of insert-molding resin material is not limited to a PBT resin. It is possible to use, as an alternative, a thermoplastic resin, a thermosetting resin, or a thermoplastic or thermosetting resin containing a filler made from glass fibers of an inorganic material or from fibers of an organic material.

Third Embodiment

Figure 22:
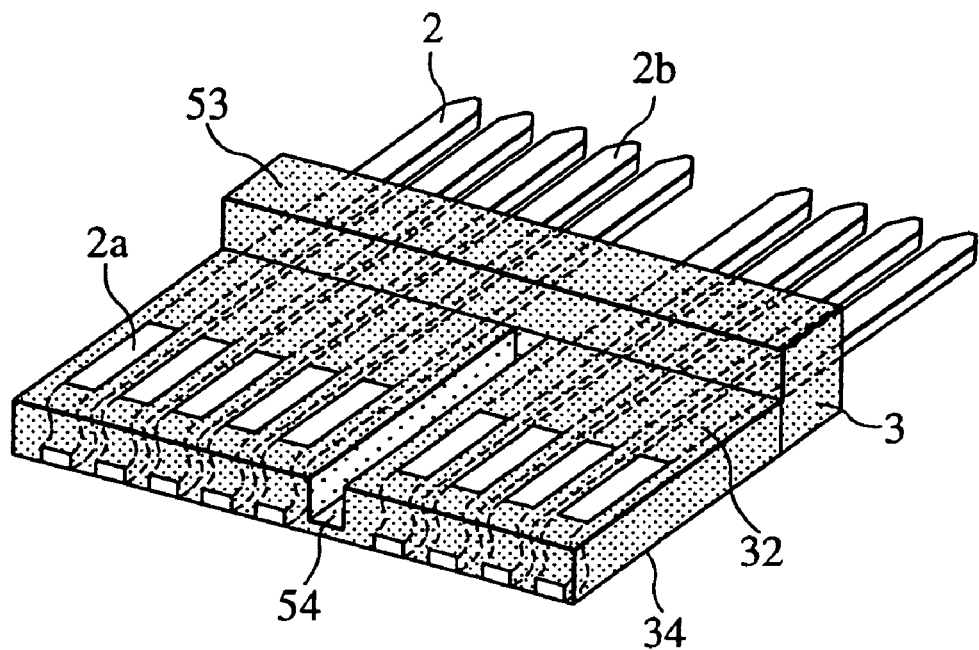
FIG. 22 is a perspective view of a primary-molded article after a recessed portion has been formed in a primary-molding resin section of the primary-molded article.
Figure 23:
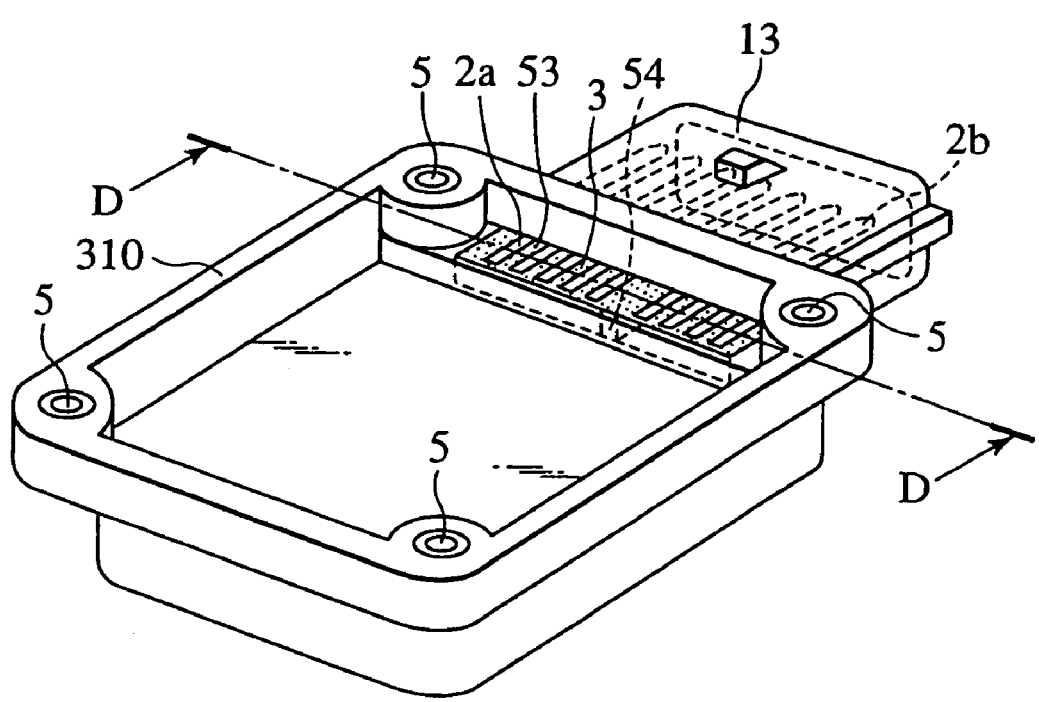
FIG. 23 is a perspective view showing a main body of the integrally multiple-molded part for electronic devices, obtained after insert-molding of the primary-molded article shown in FIG. 22.
Figure 24:
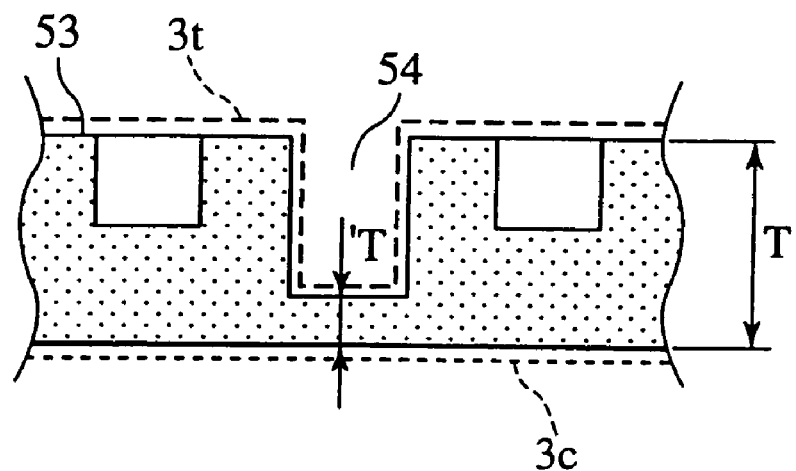
FIG. 24 is a partial cross-sectional view taken along line D-D at the recessed portion of the primary-molded article shown in FIG. 22.

A third embodiment of an integrally multiple-molded part for electronic devices, based on the present invention, is shown in FIGS. 22 to 24. The same sections as those of the foregoing embodiments are not described below.

In this third embodiment of an integrally multiple-molded part for electronic devices, as in the second embodiment, a plurality of terminals for electrical connection to outside are formed by primary molding from resin. Also, a portion that has a small cross-sectional area in a primary-molding resin section of the primary-molded article and easily deforms is formed as a stress-absorbing structure in the primary-molding resin section of the primary-molded article. In the present third embodiment, a recessed portion 54, in particular, is formed on a first surface 32 of primary molding resin 3.

FIG. 22 is a perspective view of the primary-molded article after a recessed portion has been formed in the primary-molding resin section of the primary-molded article. FIG. 23 is a perspective view showing a main body of the integrally multiple-molded part for electronic devices, obtained after insert-molding of the primary-molded article shown in FIG. 22. FIG. 24 is a partial sectional view taken along line D-D at the recessed portion of the primary-molded article shown in FIG. 22.

In FIG. 22, a primary-molded article 53 is formed by regularly arranging a plurality of metal-made electrical connection terminals 2 in parallel as an insert article, then further forming from primary molding resin 3 a recessed portion 54 with a small cross-sectional area in the molding resin section, centrally in the parallel arrangement of the above plural metal-made electrical connection terminals 2, in such a way as to orient the recessed portion 54 in parallel to the arrangement of the electrical connection terminals 2 and in the same direction as that of an exposed surface of each electrical connection terminal 2, and integrally constructing the electrical connection terminal 2 and the recessed portion 54 by use of the primary molding resin 3. The recessed portion 54 is formed so that the primary molding resin 3 is thinner than all other portions thereof, except at the recessed portion 54, with respect to a vertical direction of the exposed surface of the electrical connection terminal 2, and so that the recessed portion 54 has a shape which is small in cross-sectional area in the molding resin section and permits the recessed portion 54 to easily deform. The primary molding resin 3 constituting the primary-molded article 53 is constructed of a PBT resin containing a 30%-40% glass filler. In order to establish electrical connection to outside, each of the electrical connection terminals 2 has a contact surface 2b and a bonding surface 2a, both of which are exposed from the surface of the primary molding resin 3.

The integrally multiple-molded part main body 310 for electronic devices, shown in FIG. 23, is constructed by inserting the above-mentioned primary-molded article 53 as an insert article, and then integrally conducting secondary molding with a secondary molding resin 13. The secondary molding resin 13 constituting the molded part main body 310 is constructed of a PBT resin containing a 30%-40% glass filler. Also, a bushing 5 for installing the molded part main body 310 is inserted into each of four corners thereof. In FIG. 23, the molded part main body 310 has two exposed surfaces at its internal surface formed into a box shape. These exposed surfaces refer to the bonding surface 2a of the primary-molded article 53 and one surface of the primary molding resin 3 that becomes the same surface as the bonding surface 2a.

As in FIG. 13, inside the integrally multiple-molded part main body 310 for electronic devices that is formed into a box shape, a control circuit with an electronic component mounted thereon is composed in a process step separate from that of the molded part main body 310.

The electrical connection terminals 2 that were formed in the molded part main body 310 by repeating insert-molding a plurality of times have the bonding surface 2a formed to bond an aluminum wire. The bonding surface 2a is a wire-bonding section in which the bonding of the aluminum wire to the control circuit mounted in the molded part main body 310 is to be conducted for electrical connection. In this manner, the control circuit and the bonding surface 2a of each electrical connection terminal 2 are bonded via the aluminum wire, whereby an electronic control device is constructed.

The secondary molding resin 13 constituting the molded part main body 310 shown in FIG. 23 shrinks during a process step in which the resin 13 is solidified from a molten resin state, and the resin shrinkage compresses the primary-molded article 53 serving as a path for stress transmission. The bonding surface 2a of the primary-molded part article 53 that is exposed from the internal surface of the molded part main body 310, and the same surface of the bonding surface 2a do not come into contact with the secondary molding resin 13. The bonding surface 2a and the same surface of the bonding surface 2a, therefore, are not easily affected by transmission of stresses due to the resin shrinkage.

The resin shrinkage is described in detail below. Similarly to the second embodiment, solidification of the molten resin from a surface layer thereof, towards a resin interior, begins immediately after resin filling, and the shrinkage of the resin in the same direction as a direction in which the solidification progresses, is started simultaneously with the solidification. The secondary molding resin 13 on the lower-face side of the primary-molded article 53 that comes into contact with the secondary molding resin 13 undergoes compressive stresses due to the shrinkage of the secondary molding resin 13. The bonding surface 2a of the primary-molded part article 53 that becomes as an upper-face side not coming into contact with the secondary molding resin 13, and the same surface of the bonding surface 2a are not easily affected by the transmission of stresses due to the shrinkage of the secondary molding resin 13. A difference between the stresses acting on the upper-face side and on the lower-face side causes such bending moment in an exposed region of the primary-molded article 53 that deflects the exposed surface side into a convex shape. The bending moment that deflects the exposed surface side of the primary-molded article 53 into a convex shape causes stresses due to compressive force and tensile force to occur in the primary molding resin 3. As shown in FIG. 24, the recessed portion 54 in the primary-molded article 53 is formed so that thickness 'T of the primary molding resin 3 is smaller than thickness T thereof, except at the recessed portion 54, with respect to the vertical direction of the exposed surface of the electrical connection terminal 2, and so that the recessed portion 54 has a small cross-sectional area in the molding resin section. Even when stresses arise from the compressive force and the tensile force, therefore, the recessed portion 54 easily deforms, which means that the cross-sectional coefficient of the recessed portion 54 that is associated with a direction in which the moment 13 acts is low, and thus that the recessed portion 54, compared with other portions of the primary molding resin 3, is prone to bending deformation. Accordingly, the recessed portion 54 absorbs the shrinkage of the secondary molding resin 13 by becoming deformed, and internal stresses of the primary molding resin 3, except at the deformed recessed portion 54, are reduced. Thus, the tensile stresses occurring on the exposed bonding surface 2a of the primary-molded article 53 that faces the internal surface of the integrally multiple-molded part main body 310, and on the primary molding resin 3 that becomes the same surface as the bonding surface 2a, can be relieved in the molded part main body 310.

Relieving the above stresses makes it possible to prevent formation of clearances liable to occur between a side face of the bonding surface 2a of each electrical connection terminal 2 and the primary molding resin 3 adjacent to the side face of the bonding surface 2a.

Similarly to the first embodiment, a mechanism of aluminum wire bonding in the integrally multiple-molded part 310 for electronic devices, formed by inserting the above-constructed primary-molded article 53 into a molded part and then integrally constructing the primary-molded article 53 and the molded part, will be as shown in FIG. 14.

For the integrally multiple-molded part 310 in the present embodiment, therefore, the formation of clearances liable to occur between the side face of the bonding surface 2a of the electrical connection terminal 2 and the primary molding resin 3 adjacent to the side face of the bonding surface 2a can be prevented by relieving the tensile stresses occurring in a D-D direction on the surface of the primary-molded article 53. Hence, it is possible to obtain stable frictional force at the contact region between the bonding surface 2a of the electrical connection terminal 2 and the aluminum wire, and thus to obtain the bonding energy required and achieve high bondability.

In order to confirm such a stress-relieving action, similarly to the state shown in FIG. 8 for the first embodiment, several strain gauges were affixed to such surface of the primary molding resin 3 as becoming the same surface as the bonding surface 2a of the primary-molded article 53 that was exposed at the internal surface of the integrally multiple-molded part 310 of the present embodiment, and strain measurements were conducted using the molded part 310.

It was verified from measurement results that in the integrally multiple-molded part 310 of the present embodiment, the internal stresses of the primary molding resin 3 are also reduced similarly to the second embodiment.

These verification results on internal stress reduction indicate that similarly to the second embodiment, using also the integrally multiple-molded part of the present embodiment makes it possible to prevent the formation of clearances liable to occur between the bonding side face of the electrical connection terminal and the primary molding resin adjacent to the bonding side face. Therefore, particularly during bonding between the electrical connection terminals and the aluminum wire, the above method is effective in obtaining stable frictional force at a contact region between the bonding surface of the electrical connection terminals and the aluminum wire, and thus in obtaining the bonding energy required and achieving high bondability.

Fourth Embodiment

Figure 25:
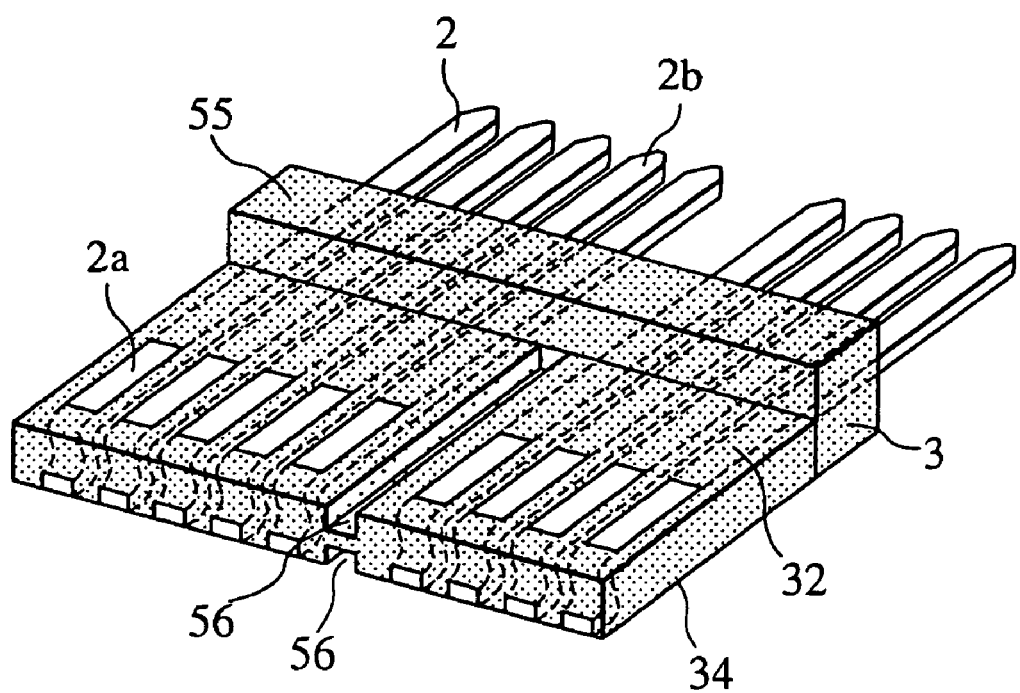
FIG. 25 is a perspective view of a primary-molded article after a recessed portion has been formed in a primary-molding resin section of the primary-molded article.
Figure 26:
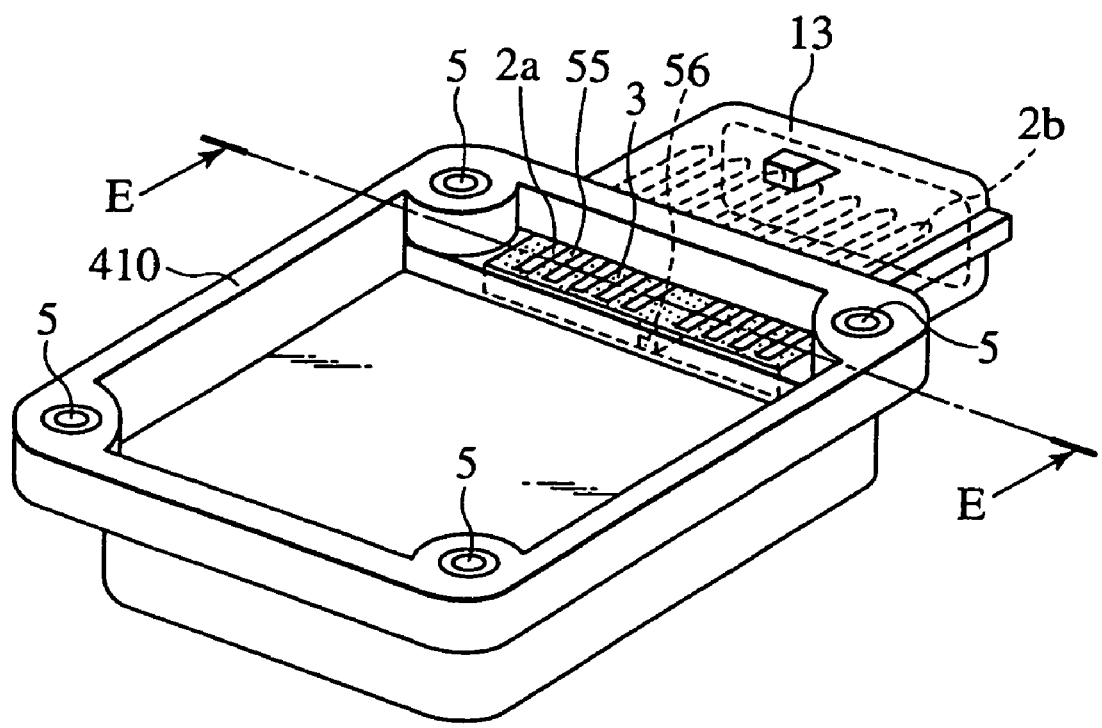
FIG. 26 is a perspective view showing a main body of the integrally multiple-molded part for electronic devices, obtained after insert-molding of the primary-molded article shown in FIG. 25.
Figure 27:
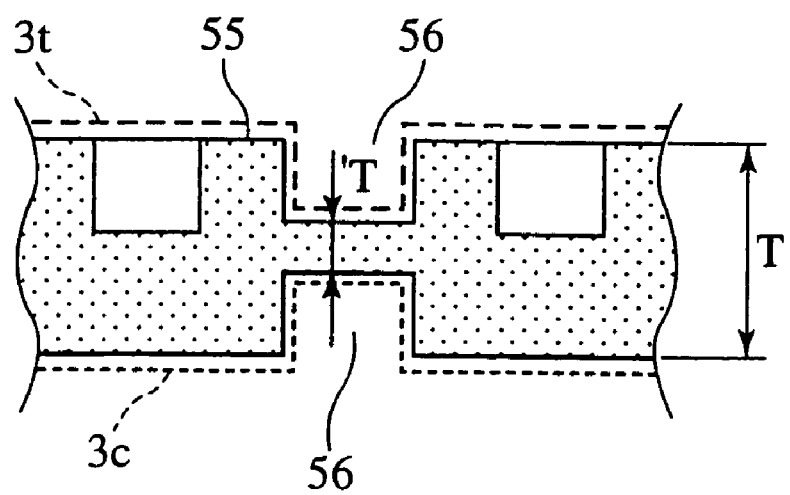
FIG. 27 is a partial cross-sectional view taken along line E-E at the recessed portion of the primary-molded article shown in FIG. 25.

A fourth embodiment of an integrally multiple-molded part for electronic devices, based on the present invention, is shown in FIGS. 25 to 27. The same sections as those of the foregoing embodiments are not described below.

In this fourth embodiment of an integrally multiple-molded part for electronic devices, a recessed portion 56 is formed as a stress-absorbing structure on both a first surface 32 and a second surface 34.

FIG. 25 is a perspective view of a primary-molded article after a recessed portion has been formed in a primary-molding resin section of the primary-molded article. FIG. 26 is a perspective view showing a main body of the integrally multiple-molded part for electronic devices, obtained after insert-molding of the primary-molded article shown in FIG. 25. FIG. 27 is a partial sectional view taken along line E-E at the recessed portion of the primary-molded article shown in FIG. 25.

In FIG. 25, a primary-molded article 55 is formed by regularly arranging a plurality of metal-made electrical connection terminals 2 in parallel as an insert article, then further forming from a primary molding resin 3 recessed portions 56 with a small cross-sectional area in the molding resin section, centrally in the parallel arrangement of the above plural metal-made electrical connection terminals 2, in such a way as to orient the recessed portions 56 in parallel to the arrangement of the electrical connection terminals 2 and in a vertical direction of an exposed surface of each electrical connection terminal 2, and integrally constructing the electrical connection terminal 2 and the recessed portion 56 by use of the primary molding resin 3.

The recessed portion 56 is formed so that the primary molding resin 3 is thinner than all other portions thereof, except at the recessed portion 56, with respect to the vertical direction of the exposed surface of the electrical connection terminal 2, and so that the recessed portion 56 has a shape which is small in cross-sectional area in the molding resin section and permits the recessed portion 56 to easily deform. The primary molding resin 3 constituting the primary-molded article 55 is constructed of a PBT resin containing a 30%-40% glass filler. In order to establish electrical connection to outside, each of the electrical connection terminals 2 has a contact surface 2b and a bonding surface 2a, both of which are exposed from the surface of the primary molding resin 3.

The integrally multiple-molded part main body 410 for electronic devices, shown in FIG. 26, is constructed by inserting the above-mentioned primary-molded article 55 as an insert article, and then integrally conducting secondary molding with a secondary molding resin 13. The secondary molding resin 13 constituting the molded part main body 410 is constructed of a PBT resin containing a 30%-40% glass filler. Also, a bushing 5 for installing the molded part main body 410 is inserted into each of four corners thereof. In FIG. 26, the molded part main body 410 has two exposed surfaces at its internal surface formed into a box shape. These exposed surfaces refer to the bonding surface 2a of the primary-molded article 55 and one surface of the primary molding resin 3 that becomes the same surface as the bonding surface 2a.

As in FIG. 13, inside the integrally multiple-molded part main body 410 for electronic devices that is formed into a box shape, a control circuit with an electronic component mounted thereon is composed in a process step separate from that of the molded part main body 410.

The electrical connection terminals 2 that were formed in the molded part main body 410 by repeating insert-molding a plurality of times have the bonding surface 2a formed to bond an aluminum wire. The bonding surface 2a is a wire-bonding section in which the bonding of the aluminum wire to the control circuit mounted in the molded part main body 410 is to be conducted for electrical connection. In this manner, the control circuit and the bonding surface 2a of each electrical connection terminal 2 are bonded via the aluminum wire, whereby an electronic control device is constructed.

The secondary molding resin 13 constituting the molded part main body 410 shown in FIG. 26 shrinks during a process step in which the resin 13 is solidified from a molten resin state, and the resin shrinkage compresses the primary-molded article 55 serving as a path for stress transmission. The bonding surface 2a of the primary-molded part article 55 that is exposed from the internal surface of the molded part main body 410, and the same surface of the bonding surface 2a do not come into contact with the secondary molding resin 13. The bonding surface 2a and the same surface of the bonding surface 2a, therefore, are not easily affected by transmission of stresses due to the resin shrinkage.

The resin shrinkage is described in detail below. Similarly to the second embodiment, solidification of the molten resin from a surface layer thereof, towards a resin interior, begins immediately after resin filling, and the shrinkage of the resin in the same direction as a direction in which the solidification progresses, is started simultaneously with the solidification. The secondary molding resin 13 on the lower-face side of the primary-molded article 55 that comes into contact with the secondary molding resin 13 undergoes compressive stresses due to the shrinkage of the secondary molding resin 13.

The bonding surface 2a of the primary-molded part article 55 that becomes as an upper-face side not coming into contact with the secondary molding resin 13, and the same surface of the bonding surface 2a are not easily affected by the transmission of stresses due to the shrinkage of the secondary molding resin 13. A difference between the stresses acting on the upper-face side and on the lower-face side causes such bending moment in an exposed region of the primary-molded article 55 that deflects the exposed surface side into a convex shape. The bending moment that deflects the exposed surface side of the primary-molded article 55 into a convex shape causes stresses due to compressive force and tensile force to occur in the primary molding resin 3.

As shown in FIG. 27, the recessed portion 56 in the primary-molded article 55 is formed so that thickness 'T of the primary molding resin 3, at the recessed portion 56, is smaller than thickness T of the primary molding resin 3, except at the recessed portion 56, with respect to the vertical direction of the exposed surface of the electrical connection terminal 2, and so that the recessed portion 56 has a small cross-sectional area in the molding resin section. Even when stresses arise from the compressive force and the tensile force, therefore, the recessed portion 56 easily deforms, which means that the cross-sectional coefficient of the recessed portion 56 that is associated with a direction in which the moment 13 acts is low, and thus that the recessed portion 56, compared with other portions of the primary molding resin 3, is prone to bending deformation.

Accordingly, the recessed portion 56 absorbs the shrinkage of the secondary molding resin 13 by becoming deformed, and internal stresses of the primary molding resin 3, except at the deformed recessed portion 56, are reduced. Thus, the tensile stresses occurring on the exposed bonding surface 2a of the primary-molded article 55 that faces the internal surface of the integrally multiple-molded part main body 410, and on the primary molding resin 3 that becomes the same surface as the bonding surface 2a, can be relieved in the molded part main body 410.

Relieving the above stresses makes it possible to prevent formation of clearances liable to occur between a side face of the bonding surface 2a of each electrical connection terminal 2 and the primary molding resin 3 adjacent to the side face of the bonding surface 2a.

Similarly to the first embodiment, a mechanism of aluminum wire bonding in the integrally multiple-molded part 410 for electronic devices, formed by inserting the above-constructed primary-molded article 55 into a molded part and then integrally constructing the primary-molded article 55 and the molded part, will be as shown in FIG. 14.

For the integrally multiple-molded part 410 in the present embodiment, therefore, the formation of clearances liable to occur between the side face of the bonding surface 2a of the electrical connection terminal 2 and the primary molding resin 3 adjacent to the side face of the bonding surface 2a can be prevented by relieving the tensile stresses occurring in an E-E direction on the surface of the primary-molded article 55. Hence, it is possible to obtain stable frictional force at a contact region between the bonding surface 2a of the electrical connection terminal 2 and the aluminum wire, and thus to obtain the bonding energy required and achieve high bondability.

In order to confirm such a stress-relieving action, similarly to the state shown in FIG. 8 for the first embodiment, several strain gauges were affixed to such surface of the primary molding resin 3 as becoming the same surface as the bonding surface 2a of the primary-molded article 55 that was exposed at the internal surface of the integrally multiple-molded part 410 of the present embodiment, and strain measurements were conducted using the molded part 410.

It was verified from measurement results that in the integrally multiple-molded part 410 of the present embodiment, the internal stresses of the primary molding resin 3 are also reduced similarly to the second embodiment.

These verification results on internal stress reduction indicate that similarly to the second embodiment, using also the integrally multiple-molded part of the present embodiment makes it possible to prevent the formation of clearances liable to occur between the bonding side face of the electrical connection terminal and the primary molding resin adjacent to the bonding side face. Therefore, particularly during bonding between the electrical connection terminals and the aluminum wire, the above method is effective in obtaining stable frictional force at the contact region between the bonding surface of the electrical connection terminals and the aluminum wire, and thus in obtaining the bonding energy required and achieving high bondability.

Fifth Embodiment

Figure 28:
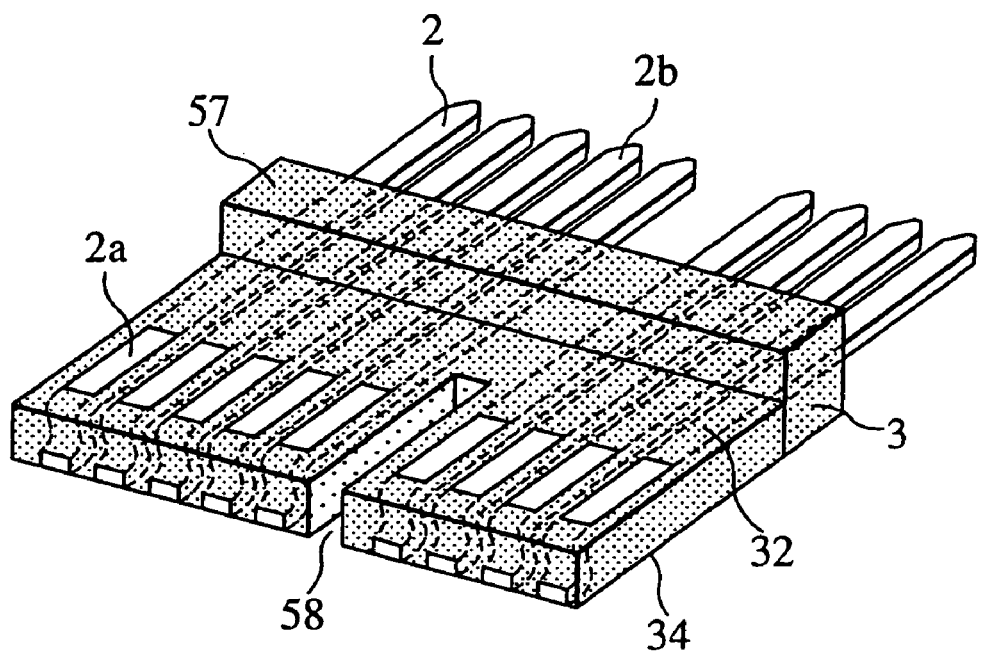
FIG. 28 is a perspective view of a primary-molded article after a recessed portion has been formed in a primary-molding resin section of the primary-molded article.
Figure 29:
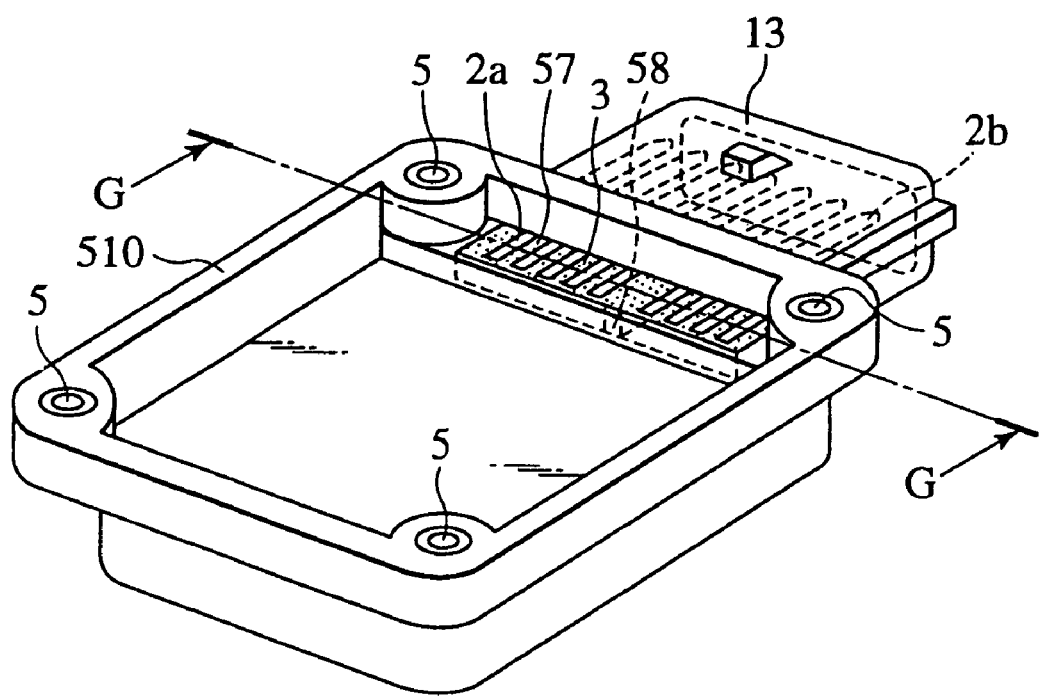
FIG. 29 is a perspective view showing a main body of the integrally multiple-molded part for electronic devices, obtained after insert-molding of the primary-molded article shown in FIG. 28.
Figure 30:
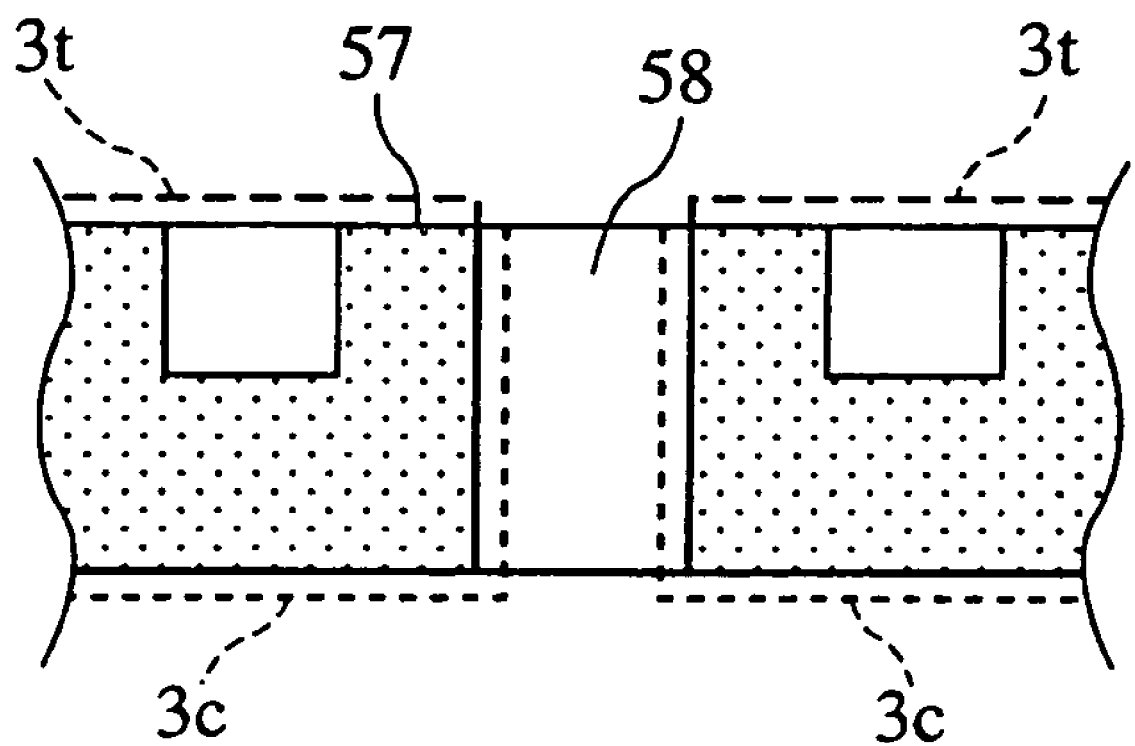
FIG. 30 is a partial sectional view taken along line G-G at the recessed portion of the primary-molded article shown in FIG. 29.

A fifth embodiment of an integrally multiple-molded part for electronic devices, based on the present invention, is shown in FIGS. 28 to 30. The same sections as those of the foregoing embodiments are not described below.

In this fifth embodiment, a hole portion 58 extending through a first surface 32 and a second surface 34 is formed as a stress-absorbing structure as another embodiment of forming the portion that has a small cross-sectional area in a mold resin section and permits easy deformation.

FIG. 28 is a perspective view of a primary-molded article after a recessed portion has been formed in a primary-molding resin section of the primary-molded article. FIG. 29 is a perspective view showing a main body of the integrally multiple-molded part for electronic devices, obtained after insert-molding of the primary-molded article shown in FIG. 28. FIG. 30 is a partial sectional view taken along line G-G at the recessed portion of the primary-molded article shown in FIG. 29.

In FIG. 28, a primary-molded article 57 is formed by regularly arranging a plurality of metal-made electrical connection terminals 2 in parallel as an insert article, then further forming, centrally in the parallel arrangement of the above plural metal-made electrical connection terminals 2, a hole portion 58 that divides a primary molding resin 3 in an arrangement direction of the electrical connection terminals 2 and in an arrangement parallel to that of the electrical connection terminals 2, and integrally constructing the electrical connection terminals 2 and the hole portion 58 by use of the primary molding resin 3. The hole portion 55 is formed to divide the primary molding resin 3 in an arrangement direction of the exposed surfaces of the electrical connection terminals 2. The primary molding resin 3 constituting the primary-molded article 57 is constructed of a PBT resin containing a 30%-40% glass filler. In order to establish electrical connection to outside, each of the electrical connection terminals 2 has a contact surface 2b and a bonding surface 2a, both of which are exposed from the surface of the primary molding resin 3.

The integrally multiple-molded part main body 510 for electronic devices, shown in FIG. 29, is constructed by inserting the above-mentioned primary-molded article 57 as an insert article, and then integrally conducting secondary molding with a secondary molding resin 13. The secondary molding resin 13 constituting the molded part main body 510 is constructed of a PBT resin containing a 30%-40% glass filler. Also, a bushing 5 for installing the molded part main body 510 is inserted into each of four corners thereof. In FIG. 29, the molded part main body 510 has two exposed surfaces at its internal surface formed into a box shape. These exposed surfaces refer to the bonding surface 2a of the primary-molded article 57 and one surface of the primary molding resin 3 that becomes the same surface as the bonding surface 2a.

As in FIG. 13, inside the integrally multiple-molded part main body 510 for electronic devices that is formed into a box shape, a control circuit with an electronic component mounted thereon is composed in a process step separate from that of the molded part main body 510.

The electrical connection terminals 2 that were formed in the molded part main body 510 by repeating insert-molding a plurality of times have the bonding surface 2a formed to bond an aluminum wire. The bonding surface 2a is a wire-bonding section in which the bonding of the aluminum wire to the control circuit mounted in the molded part main body 510 is to be conducted for electrical connection. In this manner, the control circuit and the bonding surface 2a of each electrical connection terminal 2 are bonded via the aluminum wire, whereby an electronic control device is constructed.

The secondary molding resin 13 constituting the molded part main body 510 shown in FIG. 29 shrinks during a process step in which the resin 13 is solidified from a molten resin state, and the resin shrinkage compresses the primary-molded article 57 serving as a path for stress transmission. The bonding surface 2a of the primary-molded part article 57 that is exposed from the internal surface of the molded part main body 510, and the same surface of the bonding surface 2a do not come into contact with the secondary molding resin 13. The bonding surface 2a and the same surface of the bonding surface 2a, therefore, are not easily affected by transmission of stresses due to the resin shrinkage.

The resin shrinkage is described in detail below. Similarly to the second embodiment, solidification of the molten resin from a surface layer thereof, towards a resin interior, begins immediately after resin filling, and the shrinkage of the resin in the same direction as a direction in which the solidification progresses, is started simultaneously with the solidification. The secondary molding resin 13 on the lower-face side of the primary-molded article 57 that comes into contact with the secondary molding resin 13 undergoes compressive stresses due to the shrinkage of the secondary molding resin 13. The bonding surface 2a of the primary-molded part article 57 that becomes as an upper-face side not coming into contact with the secondary molding resin 13, and the same surface of the bonding surface 2a are not easily affected by the transmission of stresses due to the shrinkage of the secondary molding resin 13. A difference between the stresses acting on the upper-face side and on the lower-face side causes such bending moment in an exposed region of the primary-molded article 57 that deflects the exposed surface side into a convex shape. The bending moment that deflects the exposed surface side of the primary-molded article 57 into a convex shape causes stresses due to compressive force and tensile force to occur in the primary molding resin 3. The primary molding resin 3 has a void as shown in FIG. 30. Compared with other portions of the primary molding resin 3, therefore, the hole portion 58 formed in the primary-molded article 57 is prone to bending deformation as s stress distribution arises from the compressive force and the tensile force. Accordingly, the hole portion 58 absorbs the shrinkage of the secondary molding resin 13 by becoming deformed, and internal stresses of the primary molding resin 3, except at the deformed recessed portion 56, are reduced. Thus, the stresses applied to the exposed bonding surface 2a of the primary-molded article 57 that faces the internal surface of the integrally multiple-molded part main body 510, and to the primary molding resin 3 that becomes the same surface as the bonding surface 2a, can be relieved in the molded part main body 510.

Relieving the above stresses makes it possible to prevent formation of clearances liable to occur between a side face of the bonding surface 2a of each electrical connection terminal 2 and the primary molding resin 3 adjacent to the side face of the bonding surface 2a.

Similarly to the first embodiment, a mechanism of aluminum wire bonding in the integrally multiple-molded part 510 for electronic devices, formed by inserting the above-constructed primary-molded article 57 into a molded part and then integrally constructing the primary-molded article 57 and the molded part, will be as shown in FIG. 14.

For the integrally multiple-molded part 510 in the present embodiment, therefore, the formation of clearances liable to occur between the side face of the bonding surface 2a of the electrical connection terminal 2 and the primary molding resin 3 adjacent to the side face of the bonding surface 2a can be prevented by relieving the tensile stresses occurring in an G-G direction on the surface of the primary-molded article 57. Hence, it is possible to obtain stable frictional force at a contact region between the bonding surface 2a of the electrical connection terminal 2 and the aluminum wire, and thus to obtain the bonding energy required and achieve high bondability.

In order to confirm such a stress-relieving action, similarly to the state shown in FIG. 8 for the first embodiment, several strain gauges were affixed to such surface of the primary molding resin 3 as becoming the same surface as the bonding surface 2a of the primary-molded article 57 that was exposed at the internal surface of the integrally multiple-molded part 510 of the present embodiment, and strain measurements were conducted using the molded part 510.

It was verified from measurement results that in the integrally multiple-molded part 510 of the present embodiment, the internal stresses of the primary molding resin 3 are also reduced similarly to the second embodiment.

These verification results on internal stress reduction indicate that similarly to the second embodiment, using also the integrally multiple-molded part of the present embodiment makes it possible to prevent the formation of clearances liable to occur between the bonding side face of the electrical connection terminal and the primary molding resin adjacent to the bonding side face. Therefore, particularly during bonding between the electrical connection terminals and the aluminum wire, the above method is effective in obtaining stable frictional force at the contact region between the bonding surface of the electrical connection terminals and the aluminum wire, and thus in obtaining the bonding energy required and achieving high bondability.

While the primary molding resin 3 and resin 13 in the above third to fifth embodiments has used the PBT resin containing a 30%-40% gas filler, the kind of insert-molding resin material is not limited to a PBT resin. It is possible to use, as an alternative, a thermoplastic resin, a thermosetting resin, or a thermoplastic or thermosetting resin containing a filler made from glass fibers of an inorganic material or from fibers of an organic material.

According to the present invention, therefore, wire bonding that has been traditionally avoided in integrally multiple-molded parts can be implemented with high reliability, and this allows design flexibility to be improved.

For the above reasons, for an integrally multiple-molded part in which a plurality of terminals for conducting electrical connections as in the present invention are formed by repeating insert-molding from resin a plurality of times, an electronic device high in wire-bonding yield and in reliability can be realized using an easy and inexpensive manufacturing method that includes generating a stress-absorbing portion in the resin and reducing the internal stresses thereof.

The integrally multiple-molded part for electronic devices, based on the present embodiment, is constructed in the above way. Therefore, the stress-absorbing structure or portion in the primary molding resin section absorbs stresses, which makes it possible to relieve internal stresses and prevent the formation of clearances liable to occur between a bonding side face of each electrical connection terminal and a primary molding resin adjacent to the bonding side face. It is thus possible to obtain stable frictional force at the contact region between a bonding surface and an aluminum wire and achieve high bondability, and there are the following advantageous effects:

According to the present embodiment, terminals can be made more compact by utilizing internal stresses due to resin shrinkage, even without spreading a section other than a bonding surface in order to prevent the occurrence of clearances with respect to resin, such as resin-coating terminal end portions other than the bonding surface or providing each terminal with bends and embedding the terminal. The utilization of internal stresses also makes it possible to arrange a greater number of terminals in an existing space and thus to further expand multifunctionality. In addition, cost performance can be significantly improved since the above method can be realized even without applying an adhesive such as an epoxy material to terminal end portions other than the bonding surface and curing the adhesive integrally with the terminal end portions.

According to the present embodiment, it is possible to obtain stable bondability without causing any dispersion of ultrasonic vibration during wire bonding particularly in such a molded part as formed by multiple molding. The parts formed by multiple molding which has been traditionally avoided, therefore, can be improved in design flexibility.

According to the present embodiment, setup of a stress-absorbing structure in a metallic mold is possible, which allows accurate disposition of the stress-absorbing structure and relatively free designing of its location and size.

According to the present embodiment, a molded part for electronic devices can be realized by disposing an electronic component on or in a mold and exchanging electrical signals with outside.

The present invention is applied to an element that forms a rotary body such as a motor, to an element for angle, position, and displacement sensing that uses a rotary body, and to the like. For example, these elements are the products used in the automobile industry. More specifically, these products are a throttle valve which adjusts an inflow air rate, a throttle position sensor installed on the throttle valve, an accelerator angle position sensor that detects the angle position of an accelerator, and other various sensors each adapted to sequentially control and configure the above sensors. In addition, the present invention is applicable not only to the products enumerated above, but also to other products, provided that the objects of the present invention are attained.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A molded part comprising:
   a first resin section having a first surface and a second surface opposed to the first surface;
   a second resin section in contact with the first resin section at the second surface of the first resin section; and a metallic section inserted into the first resin section and exposed at the first surface of the first resin section;

wherein the first resin section comprises a stress-absorbing structure.

2. The molded part according to claim 1, wherein:
the stress-absorbing structure is made of a member whose bending rigidity is smaller than that of the first resin section.

3. The molded part according to claim 1, wherein:
the stress-absorbing structure is a hole portion extending through the first surface and second surface of the first resin section.

4. The molded part according to claim 1, wherein:
the stress-absorbing structure is made of a material whose modulus of elasticity is smaller than that of the first resin section.

5. The molded part according to claim 4, wherein:
the material with a smaller modulus of elasticity contains a rubber material or an elastomer material.

6. The molded part according to claim 1, wherein:
the stress-absorbing structure is a recessed portion provided in the first resin section.

7. The molded part according to claim 6, wherein:
the recessed portion is formed on the side of the first surface.

8. The molded part according to claim 6, wherein:
the recessed portion is formed on the side of the second surface.

9. The molded part according to claim 6, wherein:
the recessed portion is formed on both sides of the first surface and the second surface.

10. An electronic device comprising:
a first resin section having a first surface and a second surface opposed to the first surface;
a second resin section in contact with the first resin section, at the second surface of the first resin section;
a plurality of electrical connection terminals each inserted into the first resin section, each electrical connection terminal extending from the first resin section to outside;
a plurality of metallic contact surfaces each exposed at the first surface of the first resin section, each metallic contact surface being electrically connected to a corresponding one of the electrical connection terminals;
an electronic component electrically connected from the plurality of metallic contact surfaces; and
a circuit board with the electronic component disposed thereon;

wherein the first resin section comprises a stress-absorbing structure.

11. The electronic device according to claim 10, wherein:
the metallic contact surfaces and the circuit board are electrically connected to one another by a bonding wire.

12. The electronic device according to claim 10, wherein:
the stress-absorbing structure is a member whose bending rigidity is smaller than that of the first resin section.

13. The electronic device according to claim 10, wherein:
the stress-absorbing structure is a hole portion extending through the first surface and second surface of the first resin section.

14. The electronic device according to claim 10, wherein:
the stress-absorbing structure is made of a material whose modulus of elasticity is smaller than that of the first resin section.

15. The electronic device according to claim 14, wherein:
the material with a smaller modulus of elasticity contains a rubber material or an elastomer material.

16. The electronic device according to claim 10, wherein:
the stress-absorbing structure is a recessed portion in the first resin section.

17. The electronic device according to claim 16, wherein:
the recessed portion is formed on the side of the first surface.

18. The electronic device according to claim 16, wherein:
the recessed portion is formed on the side of the second surface.

19. The electronic device according to claim 16, wherein:
the recessed portion is formed on both sides of the first surface and the second surface.

20. A method of manufacturing a molded part, comprising the steps of:
forming a first resin section incorporating at least one metallic electrical contact section, the first resin section having a first surface and a second surface opposed to the first surface, wherein
the at least one metallic electrical contact section is exposed at the first surface of the first resin section, and
the first resin section includes a stress-absorbing structure; and
forming a second resin section in contact with the first resin section at the second surface of the first resin section.

* * * * *